United States Patent
Kim et al.

(10) Patent No.: US 11,258,031 B2
(45) Date of Patent: Feb. 22, 2022

(54) ORGANIC LIGHT-EMITTING DEVICE AND MANUFACTURING METHOD THEREFOR

(71) Applicant: LG Chem, Ltd., Seoul (KR)

(72) Inventors: Hwakyung Kim, Daejeon (KR); Jaechol Lee, Daejeon (KR); Seokhee Yoon, Daejeon (KR); Jinseck Kim, Daejeon (KR); Esder Kang, Daejeon (KR); Jiyeon Shin, Daejeon (KR); Keunsoo Lee, Daejeon (KR); Byungjae Kim, Daejeon (KR)

(73) Assignee: LG Chem, Ltd.

( * ) Notice: Subject to any disclaimer, the term of this patent is extended or adjusted under 35 U.S.C. 154(b) by 348 days.

(21) Appl. No.: 16/493,541

(22) PCT Filed: Dec. 11, 2018

(86) PCT No.: PCT/KR2018/015705
§ 371 (c)(1),
(2) Date: Sep. 12, 2019

(87) PCT Pub. No.: WO2019/117597
PCT Pub. Date: Jun. 20, 2019

(65) Prior Publication Data
US 2020/0006693 A1    Jan. 2, 2020

(30) Foreign Application Priority Data

Dec. 11, 2017 (KR) .................. 10-2017-0169357

(51) Int. Cl.
*H01L 51/50* (2006.01)
*H01L 51/00* (2006.01)

(52) U.S. Cl.
CPC ...... *H01L 51/5088* (2013.01); *H01L 51/0003* (2013.01); *H01L 51/006* (2013.01);
(Continued)

(58) Field of Classification Search
None
See application file for complete search history.

(56) References Cited

U.S. PATENT DOCUMENTS

| | | |
|---|---|---|
| 2008/0145520 A1 | 6/2008 | Yumoto |
| 2009/0001878 A1 | 1/2009 | Qiu et al. |

(Continued)

FOREIGN PATENT DOCUMENTS

| | | |
|---|---|---|
| CN | 103493239 A | 1/2014 |
| CN | 104247077 A | 12/2014 |

(Continued)

OTHER PUBLICATIONS

Braveenth, et al., "Spirobifluorene Core-Based Novel Hole Transporting Materials for Red Phosphorescence OLEDs," Molecules, Feb. 2017, pp. 1-10, vol. 2, No. 464.

(Continued)

*Primary Examiner* — Gregory D Clark
(74) *Attorney, Agent, or Firm* — Lerner, David, Littenberg, Krumholz & Mentlik, LLP

(57) ABSTRACT

The present specification relates to an organic light emitting device comprising a first electrode; a second electrode provided opposite to the first electrode; and one or more organic material layers comprising a hole injection layer provided between the first electrode and the second electrode, wherein the hole injection layer comprises a first host, a second host and a dopant, and the first host and the second host have a HOMO energy level value difference of 0.2 eV or greater.

20 Claims, 6 Drawing Sheets

| 8 |
|---|
| 7 |
| 6 |
| 5 |
| 4 |
| 3 |
| 2 |
| 1 |

(52) U.S. Cl.
CPC ...... *H01L 51/0052* (2013.01); *H01L 51/0061* (2013.01); *H01L 51/0072* (2013.01); *H01L 2251/552* (2013.01); *H01L 2251/558* (2013.01)

(56) References Cited

U.S. PATENT DOCUMENTS

| | | |
|---|---|---|
| 2009/0206744 A1 | 8/2009 | Lim et al. |
| 2010/0044686 A1 | 2/2010 | Morishita |
| 2010/0084672 A1 | 4/2010 | Ueno et al. |
| 2010/0289008 A1 | 11/2010 | Jang et al. |
| 2013/0277655 A1 | 10/2013 | Seo et al. |
| 2014/0021451 A1 | 1/2014 | Yokoyama et al. |
| 2014/0084270 A1 | 3/2014 | Kato et al. |
| 2015/0255741 A1 | 9/2015 | Lee et al. |
| 2015/0280162 A1 | 10/2015 | Yoon et al. |
| 2016/0155950 A1* | 6/2016 | Kim .................. H01L 51/5084 257/40 |
| 2018/0301636 A1 | 10/2018 | Park et al. |
| 2019/0027689 A1 | 1/2019 | Funyuu et al. |
| 2019/0051838 A1 | 2/2019 | Yokoyama et al. |

FOREIGN PATENT DOCUMENTS

| | | |
|---|---|---|
| CN | 108431985 A | 8/2018 |
| JP | 2003272870 A | 9/2003 |
| JP | 2008179790 A | 8/2008 |
| JP | 2009026730 A | 2/2009 |
| JP | 2012193312 A | 10/2012 |
| JP | 5461787 B2 | 4/2014 |
| JP | 5658161 B2 | 1/2015 |
| JP | 2015216136 A | 12/2015 |
| JP | 2015535818 A | 12/2015 |
| KR | 20070093881 A | 9/2007 |
| KR | 20090088902 A | 8/2009 |
| KR | 100922758 B1 | 10/2009 |
| KR | 20130057425 A | 5/2013 |
| KR | 20150105520 A | 9/2015 |
| KR | 20160064320 A | 6/2016 |
| KR | 20160076461 A | 6/2016 |
| KR | 20170001552 A | 1/2017 |
| KR | 20180108616 A | 10/2018 |
| WO | 2007148660 A1 | 12/2007 |
| WO | 2008120714 A1 | 10/2008 |
| WO | 2010051259 A1 | 5/2010 |
| WO | 2011119162 A1 | 9/2011 |
| WO | 2016009823 A1 | 1/2016 |
| WO | 2017095141 A1 | 6/2017 |
| WO | 2017107117 A1 | 6/2017 |
| WO | 2017119483 A1 | 7/2017 |
| WO | 2017138569 A1 | 8/2017 |

OTHER PUBLICATIONS

International Search Report for Application No. PCT/KR2018/015705, dated Mar. 19, 2019, pp. 1-3.

* cited by examiner

【FIG. 1】
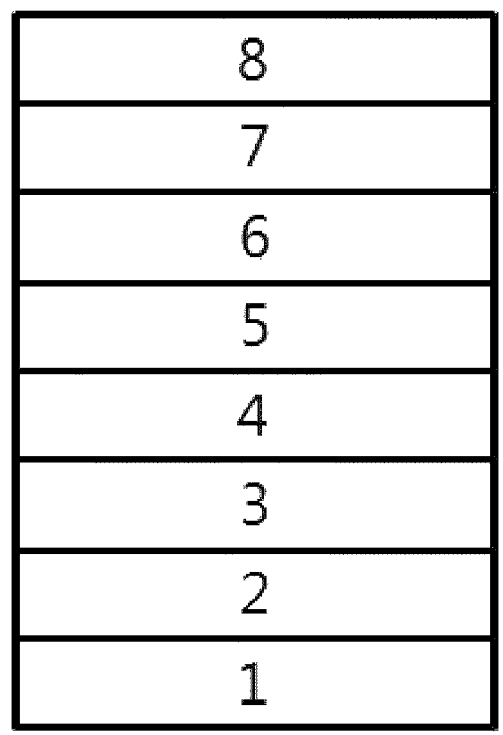

[FIG. 2]
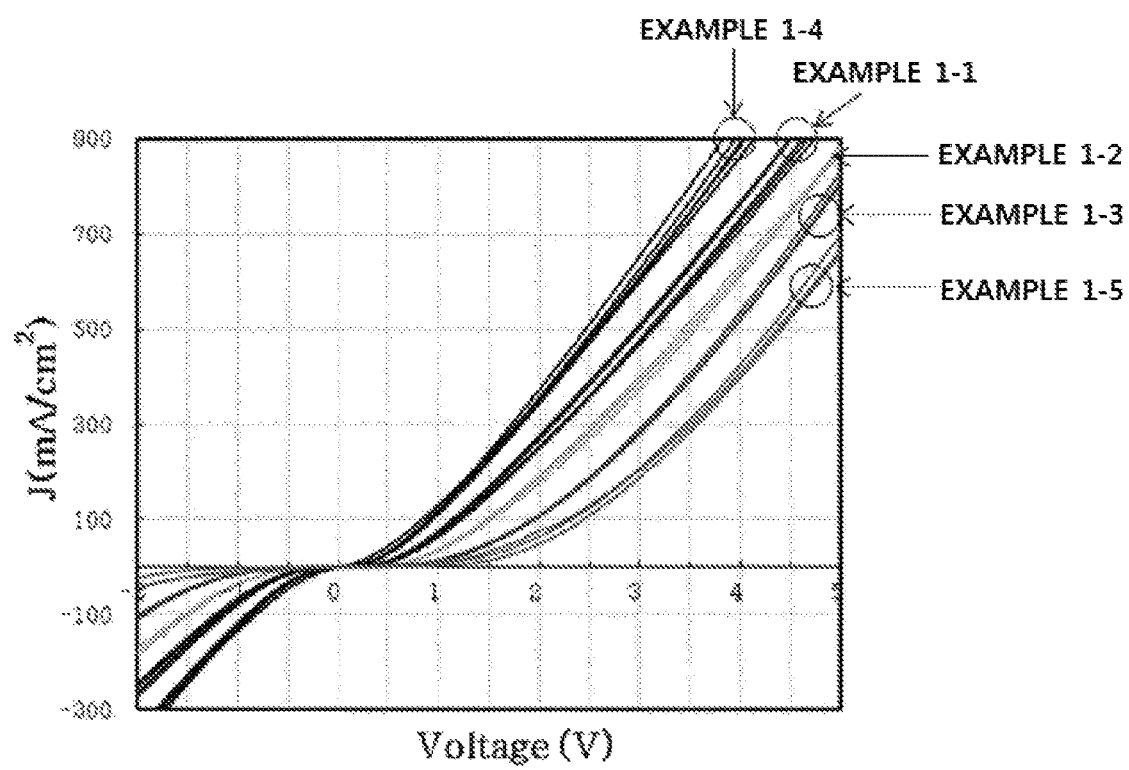

[FIG. 3]
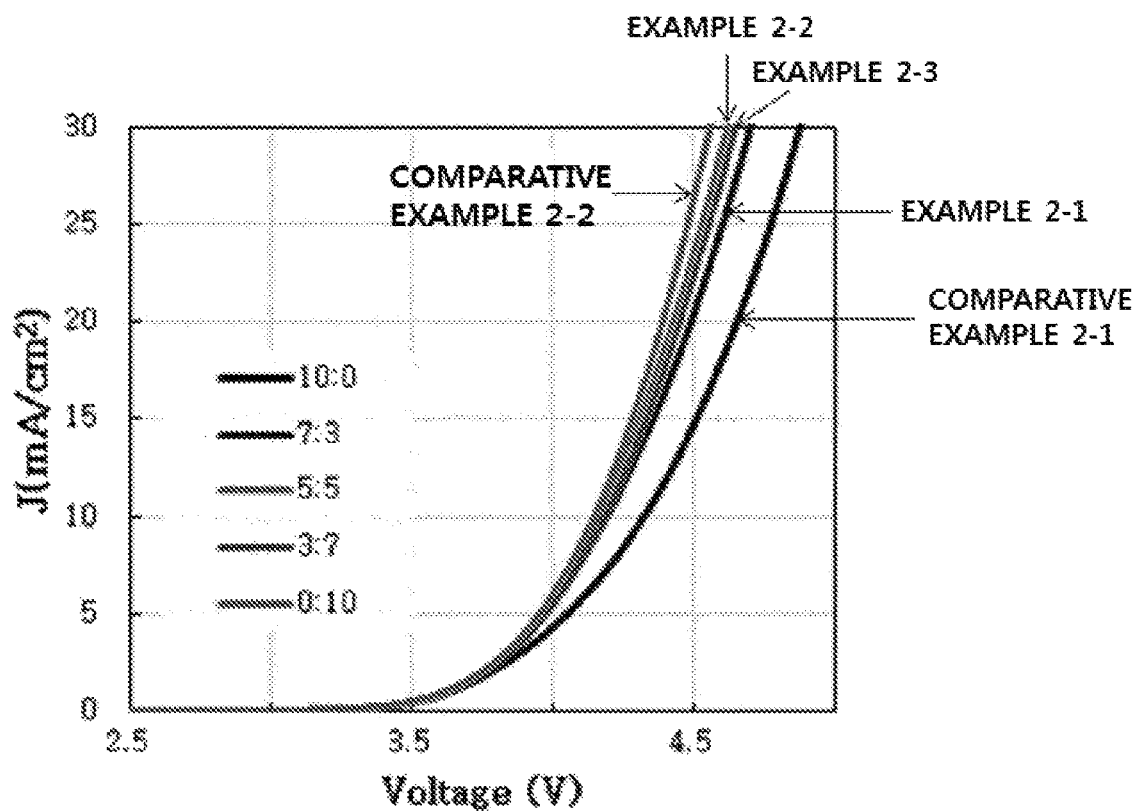

[FIG. 4]
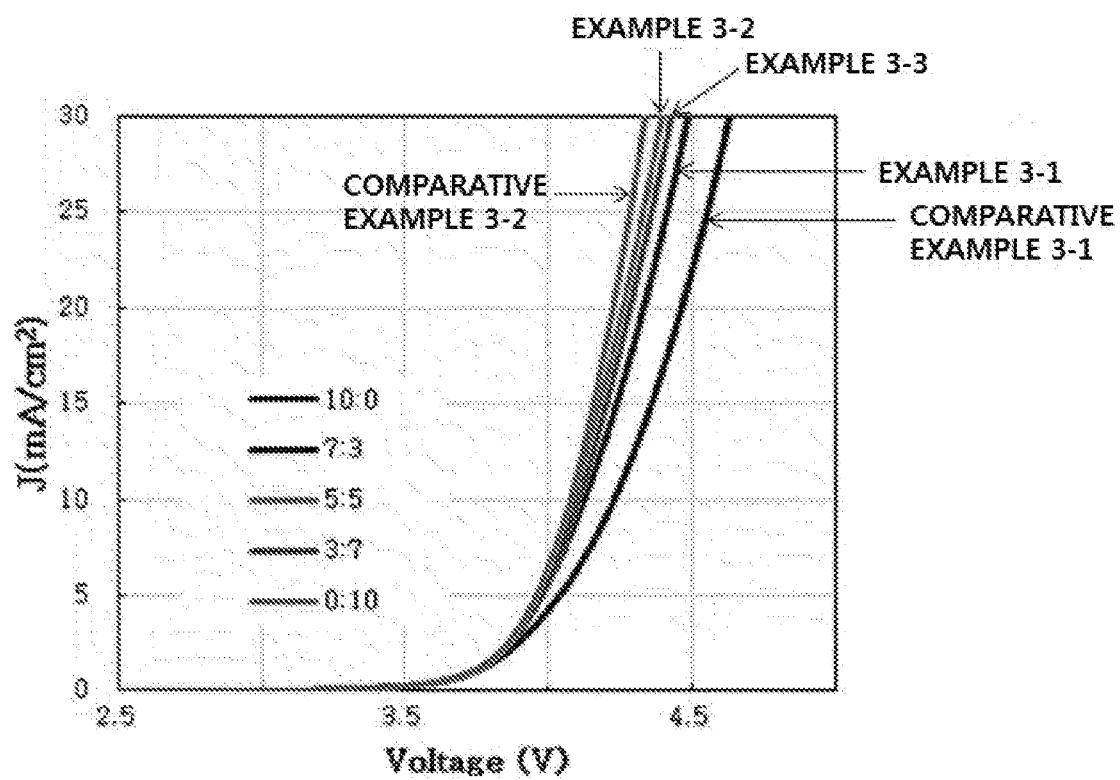

[FIG. 5]
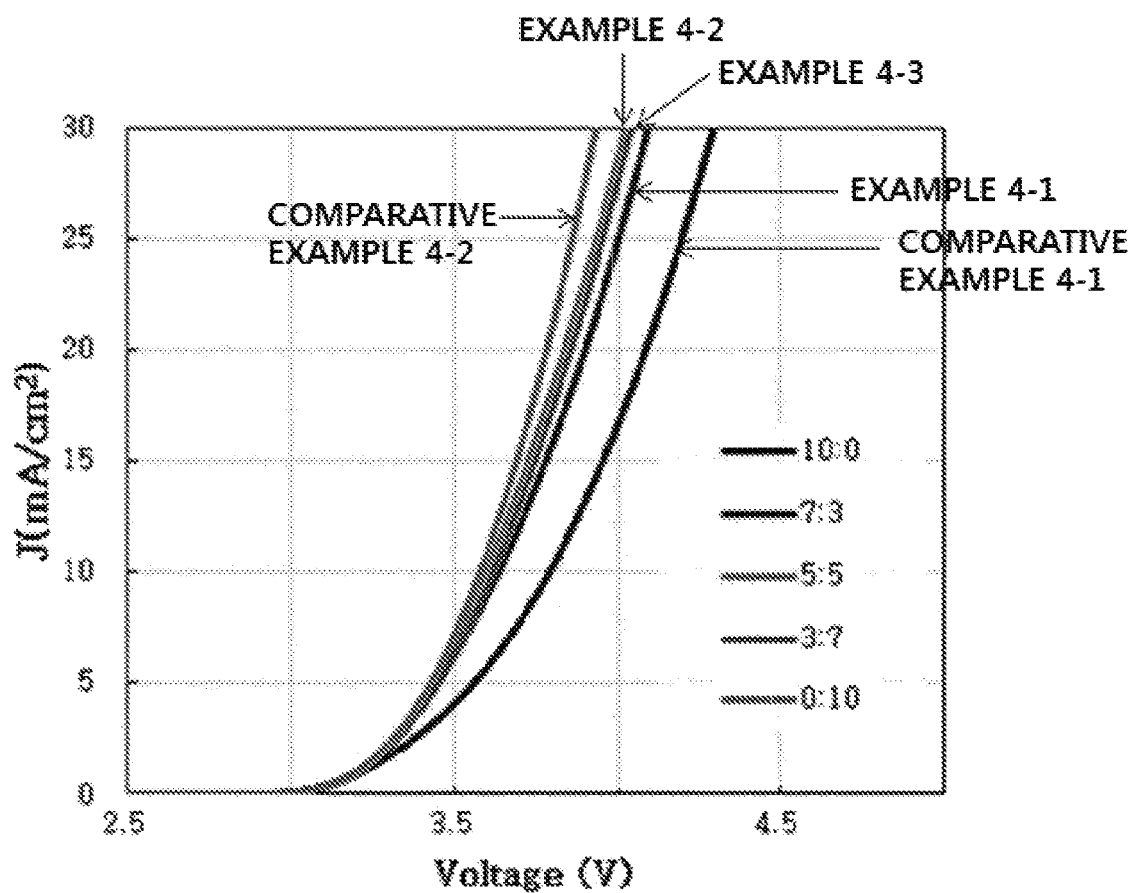

[FIG. 6]
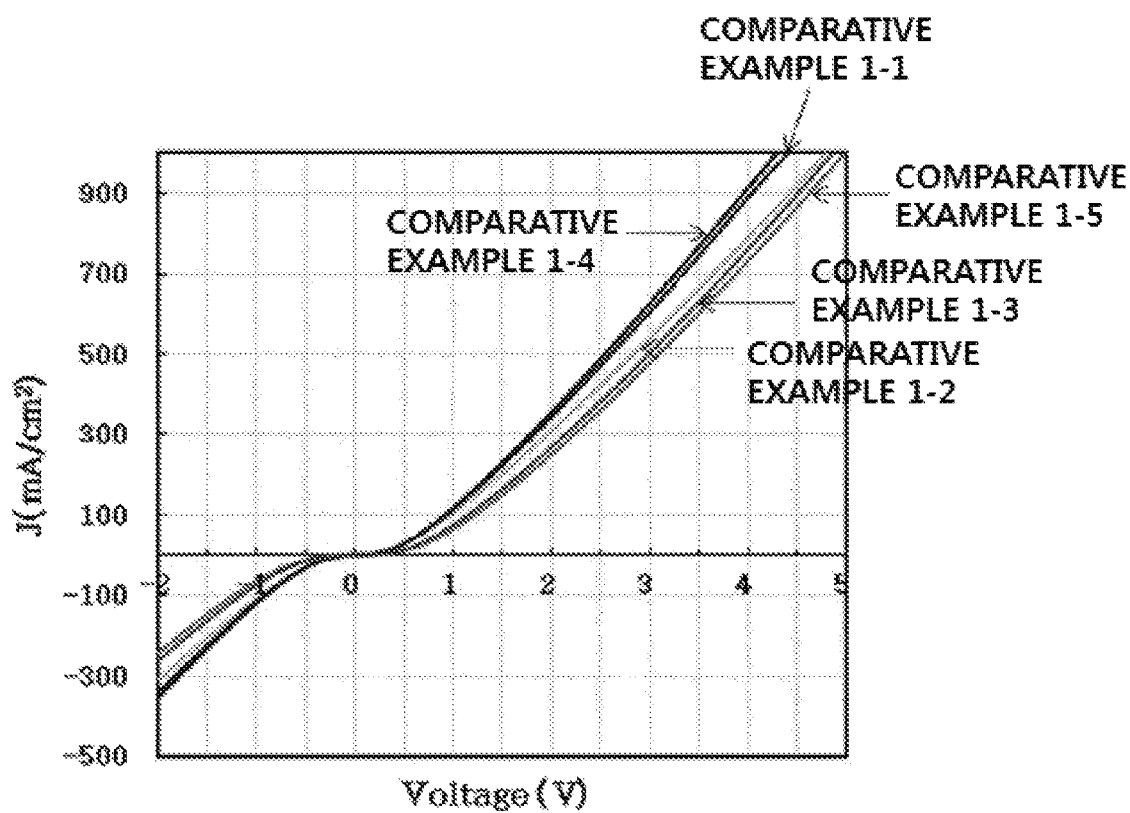

ORGANIC LIGHT-EMITTING DEVICE AND MANUFACTURING METHOD THEREFOR

CROSS-REFERENCE TO RELATED APPLICATIONS

The present application is a national phase entry under 35 U.S.C. § 371 of International Application No. PCT/KR2018/015705 filed Dec. 11, 2018, which claims priority from Korean Patent Application No. 10-2017-0169357 filed Dec. 11, 2017, all of which are incorporated herein by reference.

TECHNICAL FIELD

The present specification relates to an organic light emitting device and a method for manufacturing the same.

BACKGROUND ART

An organic light emission phenomenon is one of examples converting a current to visible light by an internal process of specific organic molecules. A principle of an organic light emission phenomenon is as follows. When an organic material layer is placed between an anode and a cathode and a current is applied between the two electrodes, electrons and holes are injected to the organic material layer from the cathode and the anode, respectively. The holes and the electrons injected to the organic material layer recombine to form excitons, and light emits when these excitons fall back to the ground state. An organic light emitting device using such a principle may be generally formed with a cathode, an anode, and an organic material layer placed therebetween, for example, an organic material layer comprising a hole injection layer, a hole transfer layer, a light emitting layer and an electron transfer layer.

When a hole injection layer comprises a host and a dopant, it is generally known that holes are formed by the host being readily oxidized by the dopant as an absolute HOMO energy level value of the host is smaller, and hole injection of the hole injection layer is readily performed. Herein, the produced holes need to migrate to a hole transfer layer, and an energy barrier of the holes is determined by a HOMO energy level difference between the hole injection layer and the hole transfer layer. The hole transfer layer generally has a higher absolute HOMO energy level value, and in order to reduce such an energy barrier, the absolute HOMO energy level value of the hole injection layer also needs to be high.

This contradicts a condition of a small absolute HOMO energy level value for enhancing hole injection properties by hole generation, and materials having a proper HOMO energy level value need to be developed when manufacturing a device. In addition, depending on the device structure, a proper HOMO energy level value of a host of a hole injection layer varies, and development of new materials is required in order to satisfy this condition.

Particularly, an organic light emitting device manufactured using a solution process has a problem in that, in addition to the physical properties of materials described above, development of materials to enable a solution process is difficult.

In addition, when using materials having different electron injection properties from existing devices as electron injection and electron transfer layers, hole injection properties also need to be different in order to increase a charge balance in a device and thereby improve performance, and accordingly, development of a hole injection layer capable of device optimization even when a structure of the device is changed has been required.

DISCLOSURE

Technical Problem

A host of a hole injection layer had to be developed so as to optimize device performance depending on a device structure and materials used in the device. In view of the above, the present specification proposes development of a hole injection layer capable of optimizing device performance by, even when a device structure is changed, properly combining two or more hosts and maximizing a charge balance in the device.

Technical Solution

One embodiment of the present specification provides an organic light emitting device comprising a first electrode; a second electrode provided opposite to the first electrode; and an organic material layer comprising a light emitting layer provided between the first electrode and the second electrode and a hole injection layer provided between the light emitting layer and the first electrode, wherein the hole injection layer comprises a first host, a second host and a dopant, and the first host and the second host has a HOMO energy level value difference of 0.2 eV or greater.

Another embodiment of the present specification provides a method for manufacturing an organic light emitting device comprising preparing a substrate; forming a first electrode on the substrate; forming a hole injection layer-comprising organic material layer on the first electrode; forming a light emitting layer-comprising organic material layer on the hole injection layer-comprising organic material layer; and forming a second electrode on the light emitting layer-comprising organic material layer, wherein the hole injection layer comprises a first host, a second host and a dopant, and the first host and the second host has a HOMO energy level value difference of 0.2 eV or greater.

Advantageous Effects

By an organic light emitting device according to one embodiment of the present disclosure comprising a first host and a second host having a HOMO energy level value difference of 0.2 eV or greater in a hole injection layer, an optimized organic light emitting device can be manufactured by maximizing a charge balance in the device even when a structure of the organic light emitting device and/or a structure of a dopant material of the hole injection layer is changed.

DESCRIPTION OF DRAWINGS

FIG. 1 illustrates an example of an organic light emitting device according to one embodiment of the present specification.

FIG. 2 is a diagram showing current density-driving voltage values of Examples 1-1 to 1-5.

FIG. 3 is a diagram showing current density-driving voltage values of Examples 2-1 to 2-3 and Comparative Examples 2-1 and 2-2.

FIG. 4 is a diagram showing current density-driving voltage values of Examples 3-1 to 3-3 and Comparative Examples 3-1 and 3-2.

FIG. 5 is a diagram showing current density-driving voltage values of Examples 4-1 to 4-3 and Comparative Examples 4-1 and 4-2.

FIG. 6 is a diagram showing current density-driving voltage values of Comparative Examples 1-1 to 1-5.

1: Substrate
2: Anode
3: Hole Injection Layer
4: Hole Transfer Layer
5: Light Emitting Layer
6: Electron Transfer Layer
7: Electron Injection Layer
8: Cathode

MODE FOR DISCLOSURE

Hereinafter, the present specification will be described in detail.

One embodiment of the present specification provides an organic light emitting device comprising a first electrode; a second electrode provided opposite to the first electrode; and an organic material layer comprising a light emitting layer provided between the first electrode and the second electrode and a hole injection layer provided between the light emitting layer and the first electrode, wherein the hole injection layer comprises a first host, a second host and a dopant, and the first host and the second host has a HOMO energy level value difference of 0.2 eV or greater.

In the present disclosure, highest occupied molecular orbital (HOMO) and lowest unoccupied molecular orbital (LUMO) energy levels are measured using Model AC-2, a photo-electron spectroscopy in air (PESA) spectrometer manufactured by Riken Keiki Co., Ltd. The measurement method is as follows. Monochromated ultraviolet light is irradiated on a surface of an organic material coated or deposited on an ITO substrate in the air, and herein, energy of the UV photon is varied stepwise from 3.4 eV to 6.2 eV. When energy of the ultraviolet light is higher than a work function of the sample material, photoelectrons are emitted from the sample surface, and this is detected and measured by a counter in the air. After plotting a graph employing the x axis as incident photon energy and the y axis as a square root of a photoelectron yield, a HOMO level is calculated as an intersection of the graph of the organic material film and the yield line. Generally, a HOMO value may be measured by a value using a CV or AC2 or AC3 device measured under the same condition or using other measurement methods, however, a difference in the level value is compared based on a HOMO value measured using the same measuring instrument since a HOMO measurement value varies depending on measuring instrument types.

In the organic light emitting device of the present disclosure, a hole injection layer comprises a first host, a second host and a dopant, and depending on a content ratio of the first host and the second host, a current density-voltage curve (J-V curve) may be adjusted to have a charge balance. Accordingly, there is an advantage in that, even when a structure of the organic light emitting device and/or a structure of the dopant material of the hole injection layer is changed, an organic light emitting device may be manufactured by adjusting a charge balance by a current density-voltage curve (J-V curve) so as to optimize the device.

In one embodiment of the present specification, the first host has a HOMO energy level of higher than or equal to 5.6 eV and lower than or equal to 4.8 eV and a LUMO energy level of higher than or equal to 2.6 eV and lower than or equal to 1.8 eV, and the second host has a HOMO energy level of higher than or equal to 5.8 eV and lower than or equal to 5.0 eV and a LUMO energy level of higher than or equal to 2.8 eV and lower than or equal to 2.0 eV.

In the present disclosure, the first host and the second host have a HOMO energy level value difference of higher than or equal to 0.2 eV and lower than or equal to 2 eV, and specifically, the difference may be higher than or equal to 0.2 eV and lower than or equal to 1 eV. When a HOMO energy level value difference between the two or more hosts included in the hole injection layer of the organic light emitting device satisfies the above-mentioned range, a difference between a LUMO energy level value of the hole injection layer dopant and a HOMO energy level value of the hole injection layer host is small, which is advantageous for hole generation, and an energy barrier at an interface between the hole injection layer and the hole transfer layer is low, which is advantageous for hole migration, and as a result, an organic light emitting device having excellent properties may be manufactured.

In the present specification, a description of one member being placed "on" another member comprises not only a case of the one member adjoining the another member but a case of still another member being present between the two members.

In the present specification, a description of a certain part "comprising" certain constituents means capable of further comprising other constituents, and does not exclude other constituents unless particularly stated on the contrary.

Hereinafter, substituents of the present specification will be described in detail.

In the present specification, the term "substitution" means a hydrogen atom bonding to a carbon atom of a compound is changed to another substituent, and the position of substitution is not limited as long as it is a position at which a hydrogen atom is substituted, that is, a position at which a substituent may substitute, and when two or more substituents substitute, the two or more substituents may be the same as or different from each other.

In the present specification, the term "substituted or unsubstituted" means being substituted with one or more substituents selected from the group consisting of deuterium; a halogen group; a cyano group (—CN); an alkyl group; an alkenyl group; and an aryl group, or being unsubstituted, or being substituted with a substituent linking two or more substituents among the substituents illustrated above, or being unsubstituted. For example, "a substituent linking two or more substituents" may comprise a biphenyl group. In other words, a biphenyl group may be an aryl group, or interpreted as a substituent linking two phenyl groups.

In the present specification, the halogen group may be fluorine (—F), chlorine (—Cl), bromine (—Br) or iodine (—I).

In the present specification, the alkyl group may be linear or branched, and although not particularly limited thereto, the number of carbon atoms may be from 1 to 60, and according to one embodiment, the number of carbon atoms of the alkyl group may be from 1 to 30. According to another embodiment, the number of carbon atoms of the alkyl group is from 1 to 10. Specific examples of the alkyl group may comprise a methyl group, an ethyl group, a propyl group, an isopropyl group, an n-butyl group, an isobutyl group, a tert-butyl group, an n-pentyl group, an n-hexyl group, an an-heptyl group and the like, but are not limited thereto.

In the present specification, the alkenyl group may be linear or branched, and although not particularly limited thereto, the number of carbon atoms may be from 2 to 30, and according to one embodiment, the number of carbon atoms of the alkenyl group may be from 2 to 20. Specific examples of the alkenyl group may comprise a vinyl group (vinyl or ethenyl group), a 1-propenyl group, an isopropenyl group, a 1-butenyl group, a 2-butenyl group, a 3-butenyl group, a 1-pentenyl group, a 2-pentenyl group, a 3-pentenyl group and the like, but are not limited thereto.

In the present specification, the aryl group is not particularly limited, but may have 6 to 60 carbon atoms, and may be a monocyclic aryl group or a polycyclic aryl group. According to one embodiment, the number of carbon atoms of the aryl group is from 6 to 30. According to one embodiment, the number of carbon atoms of the aryl group is from 6 to 20. When the aryl group is a monocyclic aryl group, examples thereof may comprise a phenyl group, a biphenyl group, a terphenyl group and the like, but are not limited thereto. Examples of the polycyclic aryl group may comprise a naphthyl group, an anthracenyl group, a phenanthrenyl group, a pyrenyl group, a perylenyl group, a triphenyl group, a chrysenyl group, a fluorenyl group and the like, but are not limited thereto.

In the present specification, the fluorenyl group may be substituted, and two substituents may bond to each other to form a spiro structure.

When the fluorenyl group is substituted, spirofluorenyl groups such as

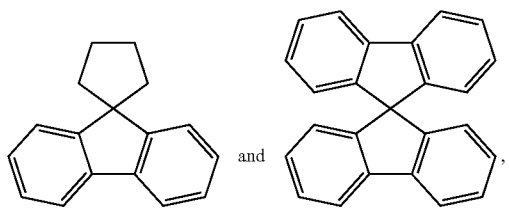

and or substituted fluorenyl groups such as

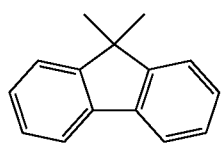

(9,9-dimethylfluorenyl group) and

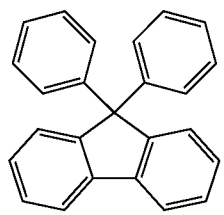 [SMILES: c1ccc(C2(c3ccccc3)c3ccccc3-c3ccccc32)cc1]

(9,9-diphenylfluorenyl group) may be included. However, the structure is not limited thereto.

In the present specification, the heteroaryl group comprises one or more of N, O, S, Si and Se as a heteroatom, and although not particularly limited thereto, the number of carbon atoms is preferably from 2 to 60. According to one embodiment, the heteroaryl group has 2 to 30 carbon atoms.

According to another embodiment, the heteroaryl group has 2 to 20 carbon atoms. Examples of the heteroaryl group may comprise a thiophene group, a furan group, a dibenzothiophene group, a dibenzofuran group and the like, but are not limited thereto.

In the present specification, descriptions on the aryl group provided above may be applied to the arylene group except that the arylene group is divalent.

In the present specification, the amine group may be selected from the group consisting of —$NH_2$; an alkylamine group; an arylalkylamine group; an arylamine group; an arylheteroarylamine group; an alkylheteroarylamine group and a heteroarylamine group, and although not particularly limited thereto, the number of carbon atoms is preferably from 1 to 60.

In the present specification, the number of carbon atoms of the alkylamine group is not particularly limited, but may be from 1 to 40, and according to one embodiment, may be from 1 to 20. Specific examples of the alkylamine group may comprise a methylamine group, a dimethylamine group, an ethylamine group, a diethylamine group and the like, but are not limited thereto.

In the present specification, examples of the arylamine group comprise a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group comprising two or more aryl groups may comprise monocyclic aryl groups, polycyclic aryl groups, or both monocyclic aryl groups and polycyclic aryl groups.

Specific examples of the arylamine group may comprise a phenylamine group, a naphthylamine group, a biphenylamine group, an anthracenylamine group, a 3-methyl-phenylamine group, a 4-methyl-naphthylamine group, a 2-methyl-biphenylamine group, a 9-methyl-anthracenylamine group, a diphenylamine group, a phenylnaphthylamine group, a biphenylphenylamine group, a dibiphenylamine group, a fluorenylphenylamine group and the like, but are not limited thereto.

In the present specification, examples of the heteroarylamine group comprise a substituted or unsubstituted monoheteroarylamine group, a substituted or unsubstituted diheteroarylamine group, or a substituted or unsubstituted triheteroarylamine group. The heteroaryl group in the heteroarylamine group may be a monocyclic heteroaryl group or a polycyclic heteroaryl group. The heteroarylamine group comprising two or more heteroaryl groups may comprise monocyclic heteroaryl groups, polycyclic heteroaryl groups, or both monocyclic heteroaryl groups and polycyclic heteroaryl groups.

In the present specification, the arylheteroarylamine group means an amine group substituted with an aryl group and a heteroaryl group.

In the present specification, the arylalkylamine group means an amine group substituted with an aryl group and an alkyl group.

In the present specification, the alkylheteroarylamine group means an amine group substituted with an alkyl group and a heteroaryl group.

According to one embodiment of the present specification, the first host and the second host are an amine-based compound.

In one embodiment of the present specification, the first host and the second host are an amine-based compound, and may each comprise 1 or more and 5 or less amine groups. When the first host and the second host comprise 1 or more and 5 or less amine groups, an energy barrier at an interface between the hole injection layer and the hole transfer layer is high since a difference between a HOMO energy level value of the hole transfer layer and a HOMO energy level value of the hole injection layer is small, which is advantageous for hole migration.

In another embodiment, a difference in the number of amine groups of the first host and the second host may be 1 or more. When a difference in the number of amine groups of the first host and the second host is 1 or more, a difference between HOMO energy level values of the first host and the second host increases, and the difference is likely to have a value of 0.2 eV or greater.

According to one embodiment of the present specification, a difference in the number of amine groups of the first host and the second host may be 1 or more and 4 or less, specifically 1 or more and 3 or less, and more specifically 1 or more and 2 or less. A difference in the number of amine groups of the first host and the second host may be 1. More specifically, the first host may be a compound having two amine groups, and the second host may be a compound having one amine group.

According to one embodiment of the present specification, the first host is represented by the following Chemical Formula 1.

[Chemical Formula 1]

In Chemical Formula 1,

L1 is a substituted or unsubstituted arylene group, and

Ar1 to Ar4 are the same as or different from each other, and each independently a substituted or unsubstituted aryl group; or a substituted or unsubstituted heteroaryl group.

In one embodiment of the present specification, L1 is a substituted or unsubstituted arylene group having 6 to 60 carbon atoms.

According to another embodiment, L1 is a substituted or unsubstituted arylene group having 6 to 30 carbon atoms.

In another embodiment, L1 is a substituted or unsubstituted phenylene group; a substituted or unsubstituted biphenylylene group; a substituted or unsubstituted naphthylene group; a substituted or unsubstituted terphenylene group; or a substituted or unsubstituted fluorenylene group.

According to another embodiment, L1 is a phenylene group unsubstituted or substituted with an alkyl group; a biphenylylene group unsubstituted or substituted with an alkyl group; a naphthylene group unsubstituted or substituted with an alkyl group; a terphenylene group unsubstituted or substituted with an alkyl group; or a fluorenylene group unsubstituted or substituted with an alkyl group.

In another embodiment, L1 is a phenylene group unsubstituted or substituted with a methyl group; a biphenylylene group unsubstituted or substituted with a methyl group; a naphthylene group unsubstituted or substituted with a methyl group; a terphenylene group unsubstituted or substituted with a methyl group; or a fluorenylene group unsubstituted or substituted with a methyl group.

According to one embodiment of the present specification, Ar1 to Ar4 are the same as or different from each other, and each independently a substituted or unsubstituted aryl group having 6 to 60 carbon atoms; or a substituted or unsubstituted heteroaryl group having 6 to 60 carbon atoms.

According to another embodiment, Ar1 to Ar4 are the same as or different from each other, and each independently a substituted or unsubstituted aryl group having 6 to 30 carbon atoms; or a heteroaryl group having 6 to 30 carbon atoms.

In another embodiment, Ar1 to Ar4 are the same as or different from each other, and each independently a substituted or unsubstituted phenyl group; a substituted or unsubstituted biphenyl group; a substituted or unsubstituted naphthyl group; a substituted or unsubstituted fluorenyl group; or a substituted or unsubstituted carbazole group.

The compound of Chemical Formula 1 may comprise a curing group, and the curing group may have the following structures. However, the structure is not limited thereto.

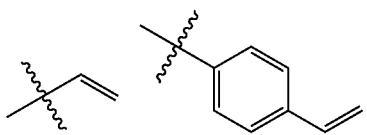

According to one embodiment of the present specification, Chemical Formula 1 may be represented by any one of the following compounds.

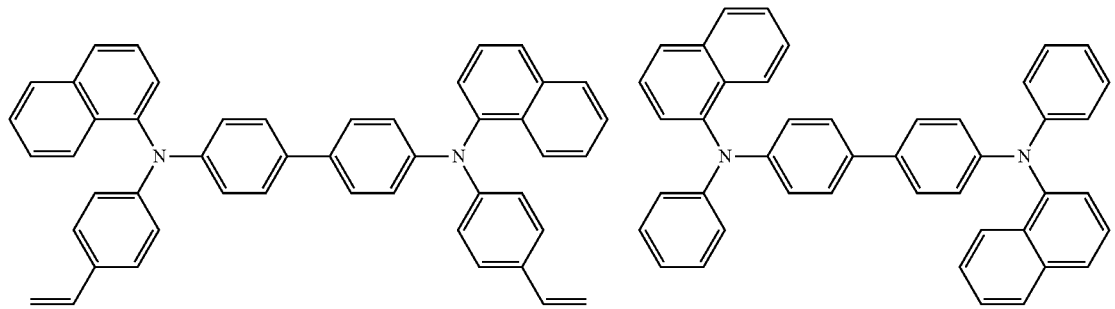

-continued
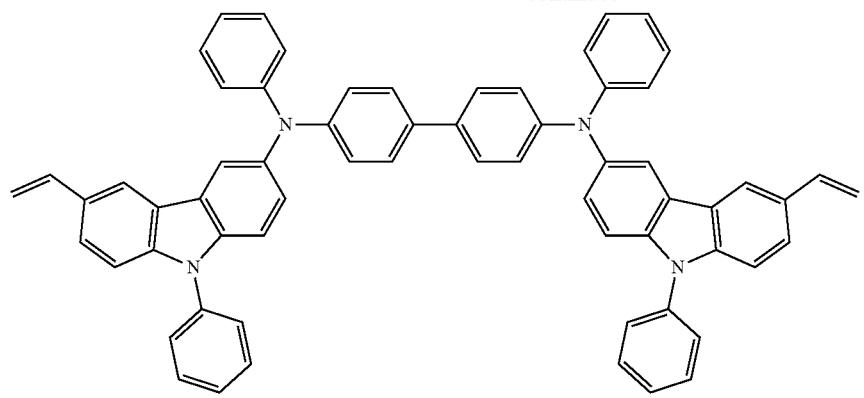
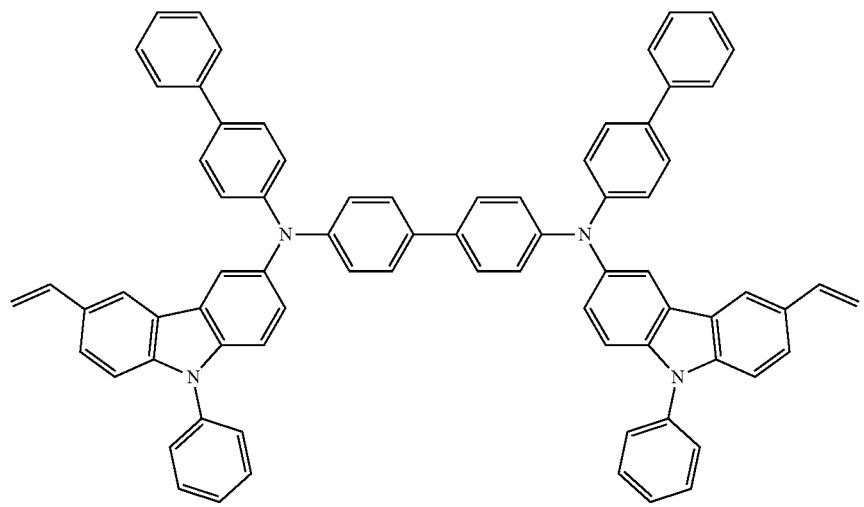
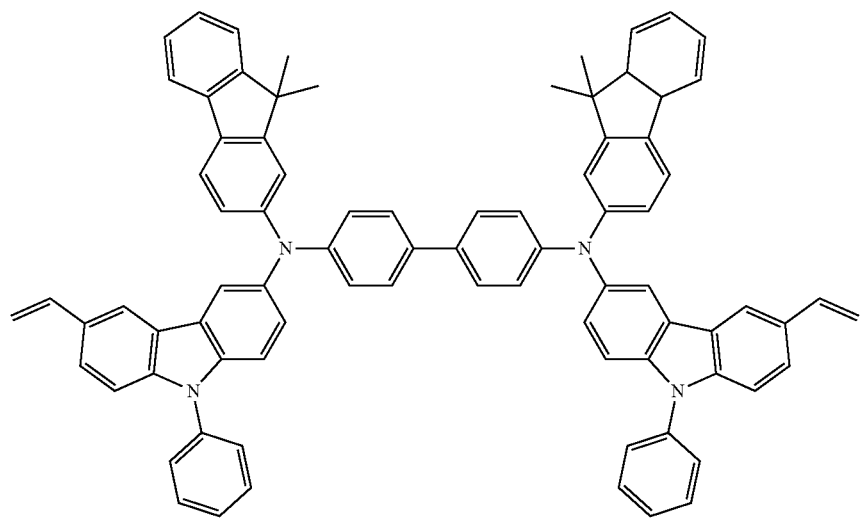

-continued
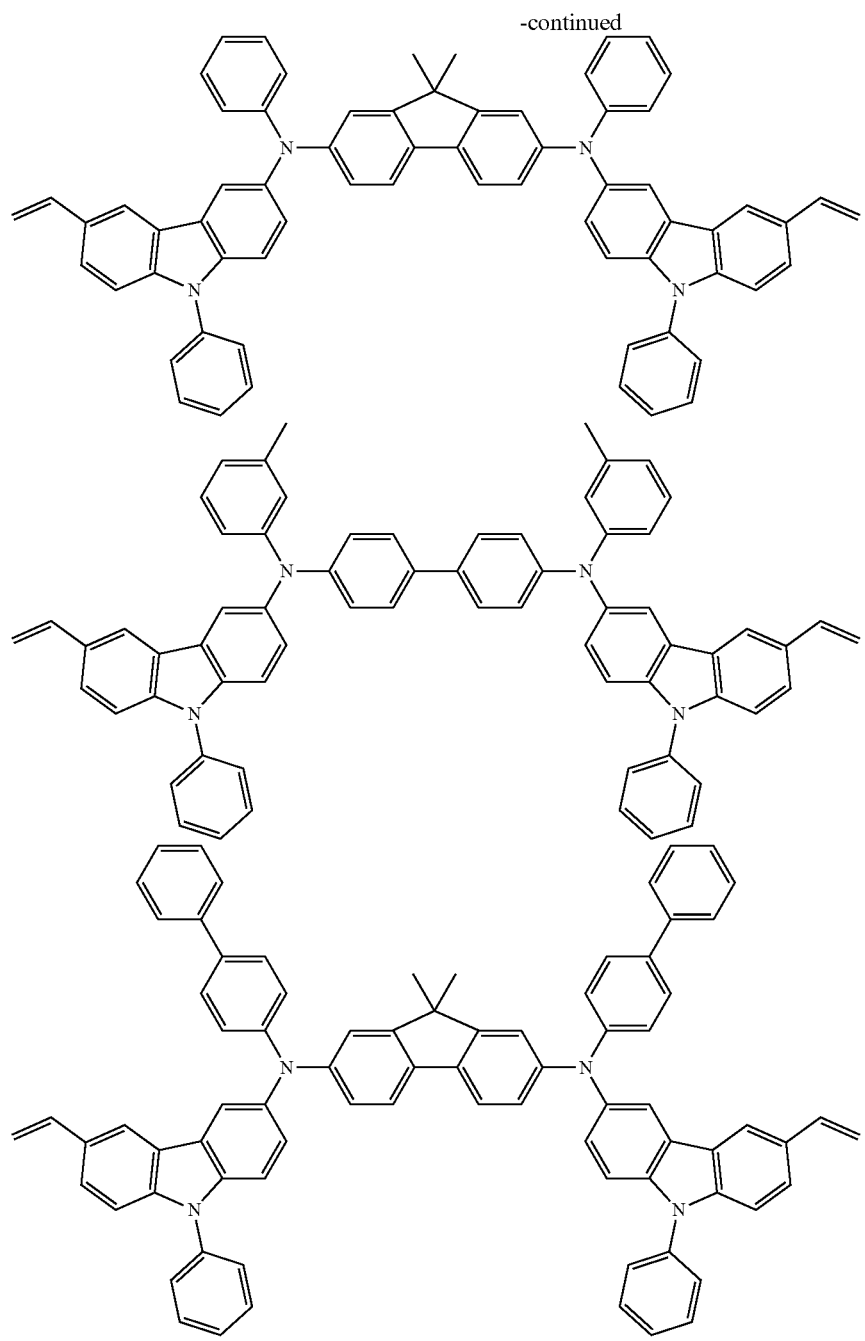
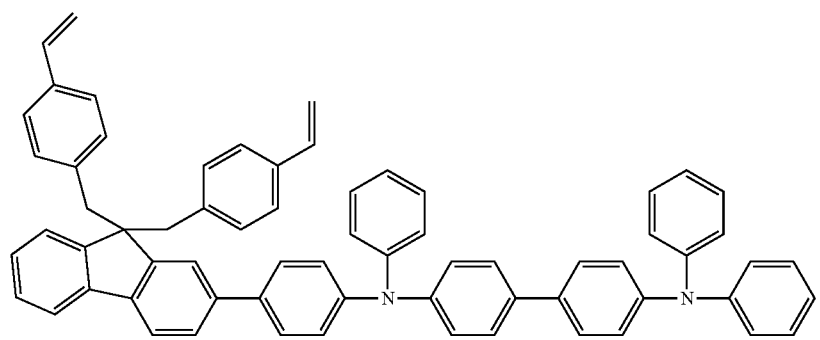

According to one embodiment of the present specification, the second host is represented by the following Chemical Formula 2.

[Chemical Formula 2]

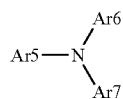

In Chemical Formula 2,

Ar5 to Ar7 are the same as or different from each other, and each independently a substituted or unsubstituted aryl group.

According to one embodiment of the present specification, Ar5 to Ar7 are the same as or different from each other, and each independently a substituted or unsubstituted aryl group having 6 to 60 carbon atoms.

In another embodiment, Ar5 to Ar7 are the same as or different from each other, and each independently a substituted or unsubstituted aryl group having 6 to 30 carbon atoms.

According to another embodiment, Ar5 to Ar7 are the same as or different from each other, and each independently a substituted or unsubstituted phenyl group; a substituted or unsubstituted biphenyl group; a substituted or unsubstituted naphthyl group; or a substituted or unsubstituted fluorenyl group.

The compound of Chemical Formula 2 may comprise a curing group, and the curing group may have the following structures. However, the structure is not limited thereto.

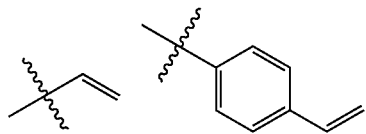

According to one embodiment of the present specification, Chemical Formula 2 may be represented by any one of the following compounds.

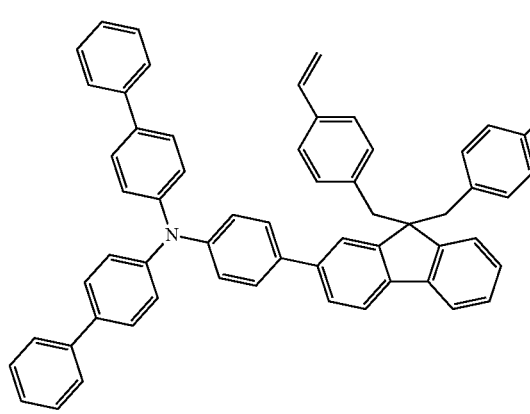

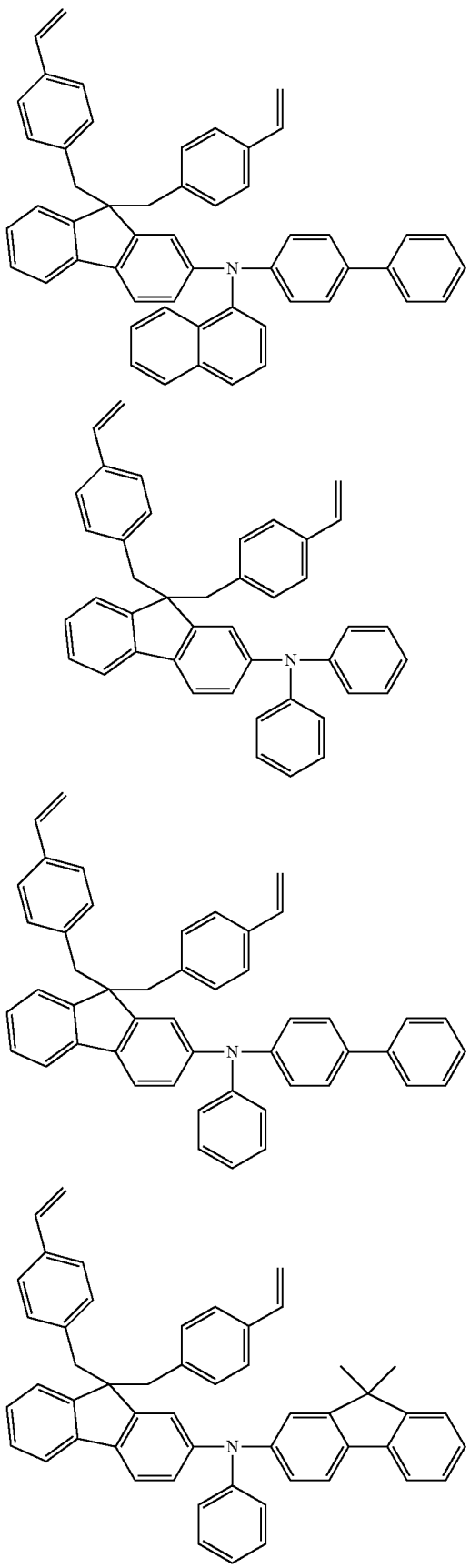

-continued

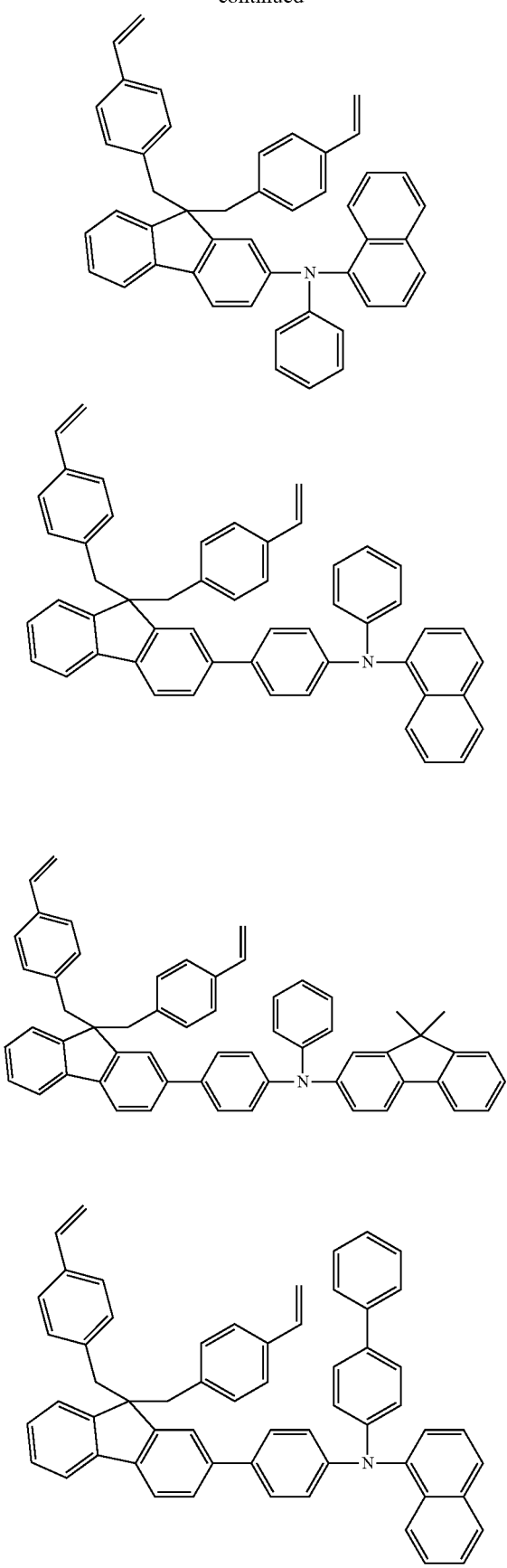

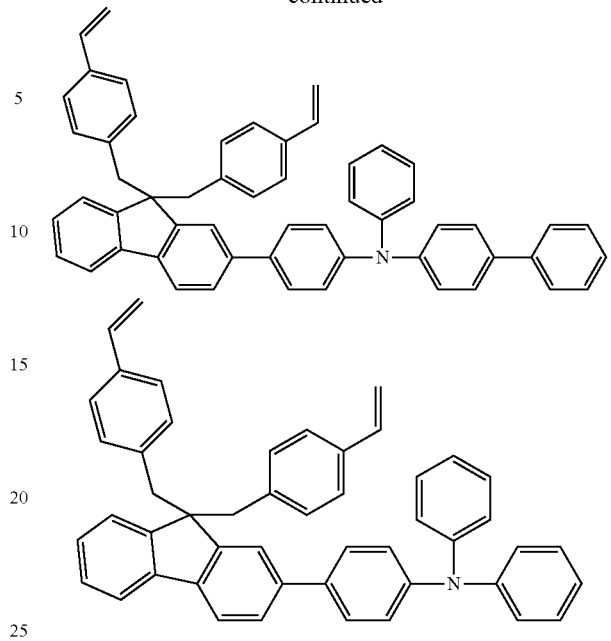

According to one embodiment of the present specification, as for the first host and the second host in a structure comprising only a first electrode formed with indium tin oxide (ITO), a hole injection layer, and a second electrode formed with Al (hole only device, HOD structure) and the hole injection layer having a thickness of 500 Å, a difference between a current density value at 2 V or 3 V when the hole injection layer comprises the first host and a current density value at 2 V or 3 V when the hole injection layer comprises the second host is 200 mA/cm$^2$ or greater, specifically greater than or equal to 200 mA/cm$^2$ and less than or equal to 600 mA/cm$^2$, and more specifically greater than or equal to 300 mA/cm$^2$ and less than or equal to 600 mA/cm$^2$.

When measuring the current density value difference, current density values at the same voltage are measured, and the difference is obtained. According to one embodiment, in a structure comprising only a first electrode formed with indium tin oxide (ITO), a hole injection layer, and a second electrode formed with Al (hole only device, HOD structure) and the hole injection layer having a thickness of 500 Å, a difference between a current density value at 2 V when the hole injection layer comprises the first host and a current density value at 2 V when the hole injection layer comprises the first host is calculated.

According to another embodiment, in a structure comprising only a first electrode formed with indium tin oxide (ITO), a hole injection layer, and a second electrode formed with Al (hole only device, HOD structure) and the hole injection layer having a thickness of 500 Å, a difference between a current density value at 3 V when the hole injection layer comprises the first host and a current density value at 3 V when the hole injection layer comprises the first host is calculated.

In the HOD structure, the hole injection layer may further comprise a dopant.

In the present disclosure, the current density values of the first host and the second host at a 2 V or 3 V voltage in the HOD structure is measured after forming a hole injection layer having a thickness of 500 Å on an ITO substrate having a thickness of 500 Å, and depositing Al to a thickness of 1000 Å thereon.

In the HOD structure, current density is calculated by measuring a current when applying a voltage from −2 V to 5 V at an interval of 0.1 V to the HOD device using a Keithley 2635B model.

When manufacturing the HOD to have a hole injection layer thickness of 500 Å in the HOD structure, a difference between current density values of the first host and the second host at a 2 V or 3 V voltage appears to be constant when measuring using an identical measuring instrument regardless of measuring instrument types.

In one embodiment of the present specification, a difference between a HOMO energy level value of one or more of the first host and the second host and a LUMO energy level value of the dopant may be 0.5 eV or less, and specifically 0.3 eV or less. A difference between a HOMO energy level value of one or more of the first host and the second host and a LUMO energy level value of the dopant satisfying the above-mentioned range has an advantage for hole generation.

In the present disclosure, an organic material layer of the organic light emitting device comprises a hole transfer layer, a difference between a HOMO energy level value of one or more of the first host and the second host and a HOMO energy level value of the hole transfer layer may be 0.5 eV or less, specifically 0.3 eV or less, and more specifically 0.2 eV or less. When a difference between a HOMO energy level value of one or more of the first host and the second host and a HOMO energy level value of the hole transfer layer satisfies the above-mentioned range, an energy barrier between the hole injection layer and the hole transfer layer is low, and holes produced in the hole injection layer readily migrate to the hole transfer layer, and therefore, an organic light emitting device having excellent properties may be manufactured.

According to one embodiment of the present specification, the content of the dopant for the first host and the second host is not particularly limited when preparing the hole injection layer, however, the content of the first host and the content of the second host may be from 1 wt % to 99 wt % based on a total weight of the first host, the second host and the dopant. More preferably, the content may be from 1 wt % to 50 wt %.

In the present disclosure, the weight ratio of the first host and the second host (first host:second host) may be from 1:9 to 9:1. More specifically, the weight ratio may be from 2:8 to 8:2.

In one embodiment of the present specification, the hole injection layer may further comprise, in addition to the first host, the second host and the dopant, a third host having a different structure from the first host and the second host, and a dopant.

In the present specification, fluorine-based compounds having many bonds between carbon and fluorine (C—F), sulfonic acid-based compounds and the like may be used as the dopant so as to perform a role of an electron acceptor, however, the dopant is not limited thereto.

Examples of the sulfonic acid-based compound may comprise benzenesulfonic acid, p-styrenesulfonic acid, 2-naphthalenesulfonic acid, 4-hydroxybenzenesulfonic acid, 5-sulfosalicyclic acid, p-dodecylbenzenesulfonic acid, dihexylbenzenesulfonic acid, 2,5-dihexylbenzenesulfonic acid, dibutylnaphthalenesulfonic acid, 6,7-dibutyl-2-naphthalenesulfonic acid, dodecylnaphthalenesulfonic acid, 3-dodecyl-2-naphthalenesulfonic acid, hexylnaphthalenesulfonic acid, 4-hexyl-1-naphthalenesulfonic acid, octylnaphthalenesulfonic acid, 2-octyl-1-naphthalenesulfonic acid, hexylnaphthalenesulfonic acid, 7-hexyl-1-naphthalenesulfonic acid, 6-hexyl-2-naphthalenesulfonic acid, dinonylnaphthalenesulfonic acid, 2,7-dinonyl-4-naphthalenesulfonic acid, dinonylnaphthalenedisulfonic acid, 2,7-dinonyl-4,5-naphthalenedisulfonic acid or the like, but are not limited thereto.

Compounds used as the dopant may specifically have the following structures, however, the structure is not limited thereto.

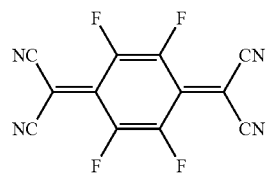

[Chemical Formula A-1]

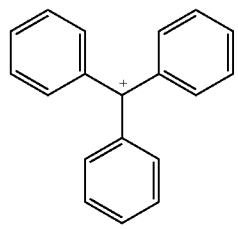 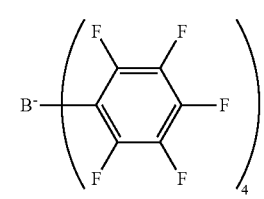

[Chemical Formula A-2]

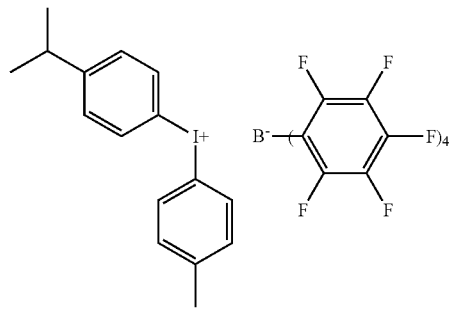

[Chemical Formula A-3]

Another embodiment of the present specification provides a method for manufacturing an organic light emitting device having the hole injection layer formed therein.

Specifically, in one embodiment of the present specification, the method for manufacturing an organic light emitting device of the present disclosure comprises forming a first electrode on a substrate; forming a hole injection layer-comprising organic material layer on the first electrode; forming a light emitting layer-comprising organic material layer on the hole injection layer-comprising organic material layer; and forming a second electrode on the light emitting layer-comprising organic material layer, wherein the hole injection layer is formed using a coating composition comprising a first host, a second host and a dopant, and the first host and the second host have a HOMO energy level value difference of 0.2 eV or greater.

In one embodiment of the present specification, the hole injection layer is formed using a solution process or a deposition process.

The solution process means spin coating, dip coating, a casting method, an offset printing method, inkjet printing, a spray method, roll coating and the like, but is not limited thereto.

According to one embodiment of the present disclosure, the hole injection layer may be formed using a coating composition comprising a first host, a second host, a dopant and a solvent.

In one embodiment of the present specification, the coating composition may be a liquid phase. The "liquid phase" means in a liquid state at room temperature and atmospheric pressure.

In one embodiment of the present specification, examples of the solvent may comprise chlorine-based solvents such as chloroform, methylene chloride, 1,2-dichloroethane, 1,1,2-trichloroethane, chlorobenzene or o-dichlorobenzene; ether-based solvents such as tetrahydrofuran or dioxane; aromatic hydrocarbon-based solvents such as toluene, xylene, trimethylbenzene or mesitylene; aliphatic hydrocarbon-based solvents such as cyclohexane, methylcyclohexane, n-pentane, n-hexane, n-heptane, n-octane, n-nonane or n-decane; ketone-based solvents such as acetone, methyl ethyl ketone, cyclohexanone, isophorone, tetralone, decalone or acetylacetone; ester-based solvents such as ethyl acetate, butyl acetate or ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin or 1,2-hexanediol, and derivatives thereof; alcohol-based solvents such as methanol, ethanol, propanol, isopropanol or cyclohexanol; sulfoxide-based solvents such as dimethyl sulfoxide; amide-based solvents such as N-methyl-2-pyrrolidone or N,N-dimethylformamide; tetraline, and the like, however, the solvent is not limited thereto as long as it is a solvent capable of dissolving or dispersing the compound of Chemical Formula 1 according to one embodiment of the present disclosure.

In another embodiment, the solvent may be used either alone as one type, or as a mixture mixing two or more solvent types.

In another embodiment, the coating composition has viscosity of 2 cP to 15 cP.

Satisfying the above-mentioned viscosity is advantageous in manufacturing a device.

Another embodiment of the present specification provides an organic light emitting device having a hole injection layer formed using the coating composition.

When manufacturing the organic light emitting device of the present disclosure, the hole injection layer may be formed using a deposition process as well as a solution process.

In one embodiment of the present specification, the organic light emitting device further comprises one, two or more layers selected from the group consisting of a hole injection layer, a hole transfer layer, an electron transfer layer, an electron injection layer, an electron blocking layer and a hole blocking layer.

In one embodiment of the present specification, the first electrode is an anode, and the second electrode is a cathode.

According to another embodiment, the first electrode is a cathode, and the second electrode is an anode.

In another embodiment, the organic light emitting device may be an organic light emitting device having a structure in which an anode, one or more organic material layers and a cathode are consecutively laminated on a substrate (normal type).

In another embodiment, the organic light emitting device may be an organic light emitting device having a structure in a reverse direction in which a cathode, one or more organic material layers and an anode are consecutively laminated on a substrate (inverted type).

The organic material layer of the organic light emitting device of the present specification may be formed in a single layer structure, but may also be formed in a multilayer structure in which two or more organic material layers are laminated. For example, the organic light emitting device of the present disclosure may have a structure comprising a hole injection layer, a hole transfer layer, a light emitting layer, an electron transfer layer, an electron injection layer and the like as the organic material layer. However, the structure of the organic light emitting device is not limited thereto, and may comprise less numbers of organic material layers.

For example, a structure of the organic light emitting device according to one embodiment of the present specification is illustrated in FIG. 1.

FIG. 1 illustrates a structure of the organic light emitting device in which an anode (2), a hole injection layer (3), a hole transfer layer (4), a light emitting layer (5), an electron transfer layer (6), an electron injection layer (7) and a cathode (8) are consecutively laminated on a substrate (1).

FIG. 1 illustrates the organic light emitting device, however, the organic light emitting device is not limited thereto.

When the organic light emitting device comprises a plurality of organic material layers, the organic material layers may be formed with materials that are the same as or different from each other.

The organic light emitting device of the present specification may be manufactured using materials and methods known in the art, except that the hole injection layer of the organic material layer comprises the first host, the second host and the dopant.

For example, the organic light emitting device of the present specification may be manufactured by consecutively laminating an anode, an organic material layer and a cathode on a substrate. Herein, the organic light emitting device may be manufactured by forming an anode on a substrate by depositing a metal, a metal oxide having conductivity, or an alloy thereof using a physical vapor deposition (PVD) method such as sputtering or e-beam evaporation, and forming an organic material layer comprising a hole injection layer, a hole transfer layer, a light emitting layer, an electron transfer layer and the like thereon through a solution process and/or a deposition process, and then depositing a material capable of being used as a cathode thereon. In addition to such a method, the organic light emitting device may also be manufactured by consecutively depositing a cathode material, an organic material layer and an anode material on a substrate.

The forming of a hole injection layer using the coating composition comprises coating the coating composition; and drying the coated coating composition.

In one embodiment of the present specification, the drying may be performed through heat treatment, and the heat treatment temperature in the drying through heat treatment may be from 85° C. to 250° C., from 100° C. to 250° C. according to one embodiment, and from 150° C. to 250° C. in another embodiment. When the heat treatment temperature satisfies the above-mentioned range, the solvent may be completely removed, and when the material of the hole injection layer comprises a curing group, the hole injection layer is sufficiently cured under the above-mentioned heat treatment condition, and damages on materials caused by a next solution process may be minimized.

In another embodiment, the heat treatment time in the drying through heat treatment is from 1 minute to 3 hours. According to one embodiment, the time may be from 1 minute to 2 hours, and in another embodiment, the time may be from 30 minutes to 1 hour. When the heat treatment time satisfies the above-mentioned range, the solvent may be completely removed, and when the material of the hole injection layer comprises a curing group, the hole injection layer is sufficiently cured under the above-mentioned heat treatment condition, and damages on materials caused by a next solution process may be minimized.

When comprising the drying through heat treatment in the forming of an organic material layer formed using the coating composition, being dissolved by a solvent, being morphologically affected, or being decomposed may be prevented when other layers are laminated on a surface of the organic material layer formed using the coating composition.

As the anode material, materials having large work function are normally preferred so that hole injection to an organic material layer is smooth. Specific examples of the anode material capable of being used in the present disclosure comprise metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

As the cathode material, materials having small work function are normally preferred so that electron injection to an organic material layer is smooth. Specific examples of the cathode material comprise metals such as barium, magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition, has an excellent thin film forming ability. The highest occupied molecular orbital (HOMO) of the hole injection material is preferably in between the work function of an anode material and the HOMO of surrounding organic material layers. Specific examples of the hole injection material comprise metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suitable. Specific examples thereof comprise arylamine-based organic materials, conductive polymers, block copolymers having conjugated parts and non-conjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof comprise 8-hydroxy-quinoline aluminum complexes ($Alq_3$); carbazole-based compounds; dimerized styryl compounds; BAlq; 10-hydroxybenzo quinoline-metal compounds; benzoxazole-, benzthiazole- and benzimidazole-based compounds; poly(p-phenylenevinylene) (PPV)-based polymers; spiro compounds; polyfluorene, rubrene, or the like, but are not limited thereto.

The light emitting layer may comprise a host material and a dopant material.

The host material comprises fused aromatic ring derivatives, heteroring-containing compounds or the like. Specifically, the fused aromatic ring derivative comprises anthracene derivatives, pyrene derivatives, naphthalene derivatives, pentacene derivatives, phenanthrene compounds, fluoranthene compounds and the like, and the heteroring-containing compound comprises carbazole derivatives, dibenzofuran derivatives, ladder-type furan compounds, pyrimidine derivatives and the like, however, the material is not limited thereto.

The dopant material comprises aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and comprises arylamino group-comprising pyrene, anthracene, chrysene, peryflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, however, the styrylamine compound is not limited thereto. In addition, the metal complex comprises iridium complexes, platinum complexes or the like, but is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suitable. Specific examples thereof comprise Al complexes of 8-hydroxyquinoline; complexes comprising Alq$_3$; organic radical compounds; hydroxyflavon-metal complexes, or the like, but are not limited thereto. The electron transfer layer may be used together with any desired cathode material as used in the art. Particularly, examples of the suitable cathode material comprise common materials that have small work function, and in which an aluminum layer or a silver layer follows. Specifically, the cathode material comprises cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition, has an excellent thin film forming ability. Specific examples thereof comprise fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited there.

The metal complex compound comprises 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)berylium, bis (10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and generally, may be formed under the same condition as the hole injection layer. Specifically, oxadiazole derivatives or triazole derivatives, phenanthroline derivatives, BCP, aluminum complexes and the like are included, however, the material is not limited thereto.

The organic light emitting device according to the present specification may be a top-emission type, a bottom-emission type or a dual-emission type depending on the materials used.

Hereinafter, the present specification will be described in detail with reference to examples in order to specifically describe the present specification. However, the examples according to the present specification may be modified to various different forms, and the scope of the present specification is not to be construed as being limited to the examples described below. Examples of the present specification are provided in order to more fully describe the present specification to those having average knowledge in the art.

EXPERIMENTAL EXAMPLE

Experimental Example 1

Example 1-1

A glass substrate on which ITO was coated as a thin film to a thickness of 500 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of acetone and isopropyl alcohol. On the transparent ITO electrode prepared as above, a composition mixing a host comprising a first host (following HIL-1) and a second host (following HIL-2), and a p-dopant (following Chemical Formula A-3) in a weight ratio of 0.8:0.2 was dissolved in a cyclohexanone solvent in 2 wt %, spin coated under the nitrogen atmosphere, and then cured on a hot plate under a condition of 220° C. and 30 minutes to form a hole injection layer having a thickness of 500 Å. Herein, as for the host used, the first host and the second host were used in a weight ratio of 7:3.

This was introduced into a vacuum depositor, and when the base pressure became 2×10$^{-5}$ Pa or lower, Al (1,000 Å) was deposited to manufacture a hole only device (HOD). In the above-mentioned process, the deposition rate of the Al was maintained at 0.1 nm/s to 0.5 nm/s.

[HIL-1]

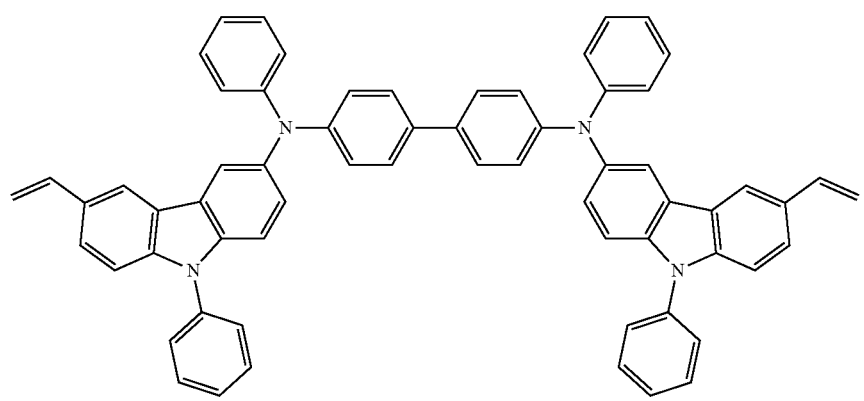

-continued

[HIL-2]

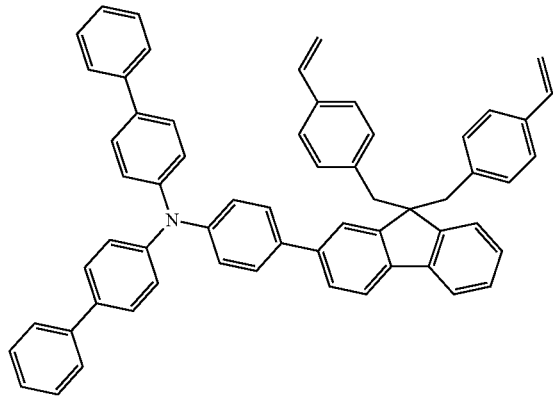

[Chemical Formula A-3]

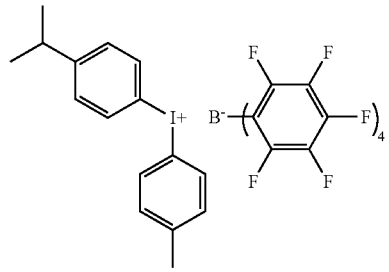

For the compounds used as the first host and the second host, the HOMO energy level values measured by AC2 are shown in the following Table 1.

TABLE 1

| HIL Host | HOMO (eV) |
| --- | --- |
| First Host | 5.18 |
| Second Host | 5.49 |

Example 1-2

An HOD device was manufactured in the same manner as in Example 1-1 except that the first host and the second host were included in a weight ratio (first host:second host) of 5:5.

Example 1-3

An HOD device was manufactured in the same manner as in Example 1-1 except that the first host and the second host were included in a weight ratio (first host:second host) of 3:7.

Example 1-4

An HOD device was manufactured in the same manner as in Example 1-1 except that the first host and the second host were included in a weight ratio (first host:second host) of 10:0.

Example 1-5

An HOD device was manufactured in the same manner as in Example 1-1 except that the first host and the second host were included in a weight ratio (first host:second host) of 0:10.

Driving voltage and current density of each of the HOD devices manufactured in Examples 1-1 to 1-5 were measured, and the results are shown in the following Table 2.

TABLE 2

|  | First Host:Second Host | Volt | J (mA/cm$^2$) |
| --- | --- | --- | --- |
| Example 1-4 | 10:0 | 3 | 605.44 |
| Example 1-1 | 7:3 | 3 | 511.96 |
| Example 1-2 | 5:5 | 3 | 389.59 |
| Example 1-3 | 3:7 | 3 | 280.84 |
| Example 1-5 | 0:10 | 3 | 208.63 |

FIG. 2 is a diagram showing current density-driving voltage values of Examples 1-1 to 1-5. The black graph presents Example 1-4, the red graph Example 1-1, the blue graph Example 1-2, the green graph Example 1-3, and the yellow graph Example 1-5.

Comparative Example 1-1

An HOD device was manufactured in the same manner as in Example 1-1 except that the following third host ([HIL-3]) was used instead of the second host. The following first host and third host have a HOMO energy level value difference of less than 0.2 eV.

[HIL-3]

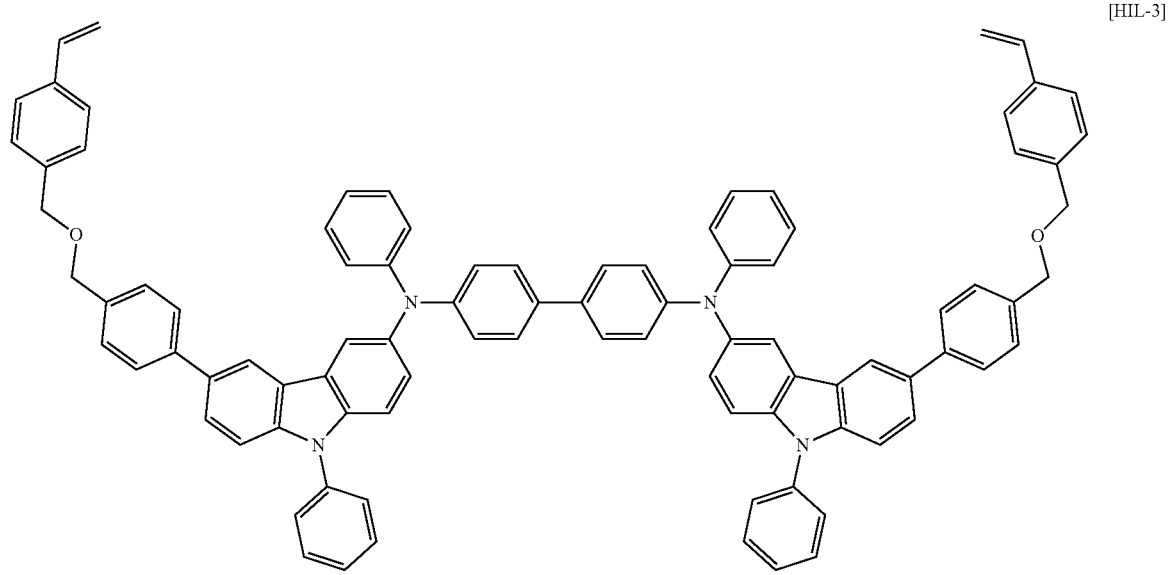 [SMILES: C=Cc1ccc(COCc2ccc(-c3ccc4c(c3)c3cc(N(c5ccccc5)c5ccc(-c6ccc(N(c7ccccc7)c7ccc8c(c7)c7cc(-c9ccc(COCc%10ccc(C=C)cc%10)cc9)ccc7n8-c7ccccc7)cc6)cc5)ccc3n4-c3ccccc3)cc2)cc1]

Comparative Example 1-2

An HOD device was manufactured in the same manner as in Comparative Example 1-1 except that the first host and the third host were included in a weight ratio (first host:third host) of 5:5.

Comparative Example 1-3

An HOD device was manufactured in the same manner as in Comparative Example 1-1 except that the first host and the third host were included in a weight ratio (first host:third host) of 3:7.

Comparative Example 1-4

An HOD device was manufactured in the same manner as in Comparative Example 1-1 except that the first host and the third host were included in a weight ratio (first host:third host) of 10:0.

Comparative Example 1-5

An HOD device was manufactured in the same manner as in Comparative Example 1-1 except that the first host and the third host were included in a weight ratio (first host:third host) of 0:10.

Driving voltage and current density of each of the HOD devices manufactured in Comparative Examples 1-1 to 1-5 were measured, and the results are shown in the following Table 3.

TABLE 3

| | First Host:Third host | Volt | J (mA/cm$^2$) |
|---|---|---|---|
| Comparative Example 1-4 | 10:0 | 3 | 626.25 |
| Comparative Example 1-1 | 7:3 | 3 | 605.97 |
| Comparative Example 1-2 | 5:5 | 3 | 541.27 |
| Comparative Example 1-3 | 3:7 | 3 | 503.48 |
| Comparative Example 1-5 | 0:10 | 3 | 480.67 |

From Table 2, it was identified that, when the hole injection layer comprises a first host (HIL-1) and a second host (HIL-2) having a HOMO energy level value difference of 0.2 eV or greater, a difference (J) in the hole injection properties depending on a mixing ratio of the two materials is large. Accordingly, it was identified that, when using the hole injection layer in an organic light emitting device, a charge balance in the device may be optimized by, even when materials included in an electron transfer layer, a light emitting layer and the like are changed, adjusting a mixing ratio of the two materials.

However, from Table 3, it was identified that, when a hole injection layer comprises a first host (HIL-1) and a third host (HIL-3) having a HOMO energy level value difference of less than 0.2 eV, a difference (J) in the hole injection properties is not large even when adjusting a mixing ratio of the two materials. From this, it was identified that, when using the hole injection layer in an organic light emitting device, a charge balance in the device is not readily optimized when materials included in an electron transfer layer, a light emitting layer and the like are changed even by adjusting a mixing ratio of the hole injection layer materials (first host and third host).

FIG. 6 is a diagram showing current density-driving voltage values of Comparative Examples 1-1 to 1-5. The black graph presents Comparative Example 1-4, the red graph Comparative Example 1-1, the blue graph Comparative Example 1-2, the green graph Comparative Example 1-3, and the yellow graph Comparative Example 1-5.

Experimental Example 2

Example 2-1

A glass substrate on which ITO was coated as a thin film to a thickness of 500 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of acetone and isopropyl alcohol.

On the transparent ITO electrode prepared as above, a composition mixing a first host (HIL-1) and a second host (HIL-2), and a p-dopant (following Chemical Formula A-3) in a weight ratio of 0.8:0.2 was dissolved in a cyclohexanone solvent in 2 wt %, spin coated under the nitrogen atmosphere, and then cured on a hot plate under a condition of 220° C. and 30 minutes to form a hole injection layer having a thickness of 400 Å. Herein, as for the host used, the first host and the second host were used in a weight ratio of 7:3.

On the hole injection layer formed as above, a solution dissolving the following Compound 1 in toluene in 1 wt % was spin coated under the nitrogen atmosphere, and then heat treated on a hot plate under a condition of 120° C. and 100 minutes to form a hole transfer layer having a thickness of 200 Å.

The substrate formed as above was introduced into a vacuum depositor, and when the base pressure became $2 \times 10^{-5}$ Pa or lower, the following Compound 2 and the following Compound 3 were deposited at the same time to form a 200 Å light emitting layer. Herein, Compound 3 used as a dopant was used in a 5% mass ratio. After that, an electron transfer layer (ETL-A) was deposited to 350 Å. After that, LiF (10 Å) and Al (1,000 Å) were consecutively deposited to manufacture an organic light emitting device. In the above-mentioned process, the organic materials other than Compound 3 were formed at deposition rates of 1 Å/s to 2 Å/s, and the deposition rate of the LiF was maintained at 0.1 Å/s to 0.5 Å/s, and the deposition rate of the Al at 1 Å/s to 5 Å/s.

[Compound 1]

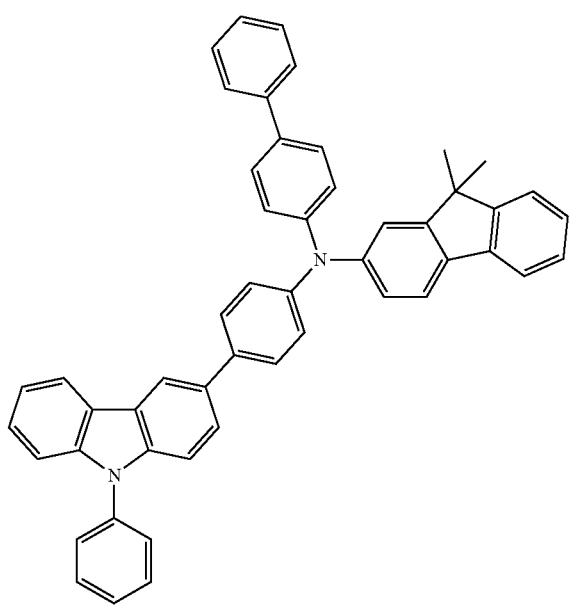

[Compound 2]

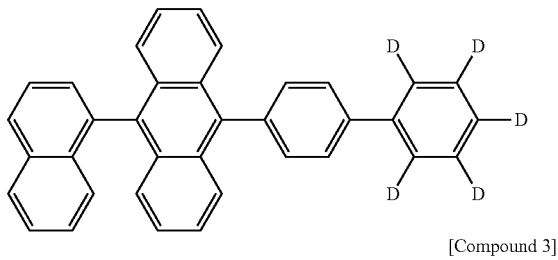

[Compound 3]

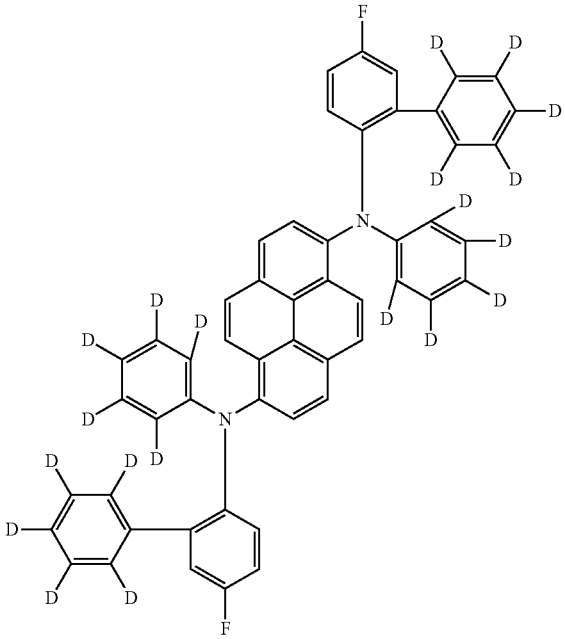

[Chemical Formula A-3]

Example 2-2

An organic light emitting device was manufactured in the same manner as in Example 2-1 except that the first host and the second host were included in a weight ratio (first host:second host) of 5:5.

Example 2-3

An organic light emitting device was manufactured in the same manner as in Example 2-1 except that the first host and the second host were included in a weight ratio (first host:second host) of 3:7.

Comparative Example 2-1

An organic light emitting device was manufactured in the same manner as in Example 2-1 except that the first host and the second host were included in a weight ratio (first host:second host) of 10:0.

Comparative Example 2-2

An organic light emitting device was manufactured in the same manner as in Example 2-1 except that the first host and the second host were included in a weight ratio (first host:second host) of 0:10.

For the organic light emitting devices manufactured in Examples 2-1 to 2-3 and Comparative Examples 2-1 and 2-2, values measuring driving voltage, current density, light efficiency and color coordinate are described in the following Table 4, and FIG. 3 is a diagram showing current density-driving voltage values of Examples 2-1 to 2-3 and Comparative Examples 2-1 and 2-2.

The black graph presents Comparative Example 2-1, the red graph Example 2-1, the blue graph Example 2-2, the green graph Example 2-3, and the orange graph Comparative Example 2-2.

TABLE 4

| | Hole Injection Layer (First Host:Second Host) | Electron Transfer Layer | Volt | J (mA/cm$^2$) | lm/W | CIEx | CIEy |
|---|---|---|---|---|---|---|---|
| Comparative Example 2-1 | 10:0 | ETL-A | 4.40 | 10 | 3.62 | 0.137 | 0.099 |
| Example 2-1 | 7:3 | ETL-A | 4.27 | 10 | 3.73 | 0.137 | 0.098 |
| Example 2-2 | 5:5 | ETL-A | 4.24 | 10 | 3.71 | 0.137 | 0.098 |
| Example 2-3 | 3:7 | ETL-A | 4.26 | 10 | 3.59 | 0.137 | 0.098 |
| Comparative Example 2-2 | 0:10 | ETL-A | 4.22 | 10 | 3.55 | 0.137 | 0.099 |

Experimental Example 3

Example 3-1

An organic light emitting device was manufactured in the same manner as in Example 2-1 except that LG-201 was used as the electron transfer layer material instead of ETL-A.

Example 3-2

An organic light emitting device was manufactured in the same manner as in Example 3-1 except that the first host and the second host were included in a weight ratio (first host:second host) of 5:5.

Example 3-3

An organic light emitting device was manufactured in the same manner as in Example 3-1 except that the first host and the second host were included in a weight ratio (first host:second host) of 3:7.

Comparative Example 3-1

An organic light emitting device was manufactured in the same manner as in Example 3-1 except that the first host and the second host were included in a weight ratio (first host:second host) of 10:0.

Comparative Example 3-2

An organic light emitting device was manufactured in the same manner as in Example 3-1 except that the first host and the second host were included in a weight ratio (first host:second host) of 0:10.

For the organic light emitting devices manufactured in Examples 3-1 to 3-3 and Comparative Examples 3-1 and 3-2, values measuring driving voltage, current density, light efficiency and color coordinate are described in the following Table 5, and FIG. 4 is a diagram showing current density-driving voltage values of Examples 3-1 to 3-3 and Comparative Examples 3-1 and 3-2.

The black graph presents Comparative Example 3-1, the red graph Example 3-1, the blue graph Example 3-2, the green graph Example 3-3, and the orange graph Comparative Example 3-2.

TABLE 5

| | Hole Injection Layer (First Host:Second Host) | Electron Transfer Layer | Volt | J (mA/cm$^2$) | lm/W | CIEx | CIEy |
|---|---|---|---|---|---|---|---|
| Comparative Example 3-1 | 10:0 | LG-201 | 4.30 | 10 | 3.42 | 0.137 | 0.109 |
| Example 3-1 | 7:3 | LG-201 | 4.20 | 10 | 3.48 | 0.137 | 0.108 |
| Example 3-2 | 5:5 | LG-201 | 4.16 | 10 | 3.53 | 0.137 | 0.108 |
| Example 3-3 | 3:7 | LG-201 | 4.18 | 10 | 3.44 | 0.137 | 0.109 |
| Comparative Example 3-2 | 0:10 | LG-201 | 4.15 | 10 | 3.49 | 0.137 | 0.110 |

Experimental Example 4

Example 4-1

An organic light emitting device was manufactured in the same manner as in Example 2-1 except that LG-201 and Liq were used as the electron transfer layer material instead of ETL-A.

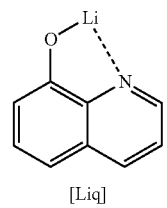

[Liq]

Example 4-2

An organic light emitting device was manufactured in the same manner as in Example 4-1 except that the first host and the second host were included in a weight ratio (first host:second host) of 5:5.

Example 4-3

An organic light emitting device was manufactured in the same manner as in Example 4-1 except that the first host and the second host were included in a weight ratio (first host:second host) of 3:7.

Comparative Example 4-1

An organic light emitting device was manufactured in the same manner as in Example 4-1 except that the first host and the second host were included in a weight ratio (first host:second host) of 10:0.

Comparative Example 4-2

An organic light emitting device was manufactured in the same manner as in Example 4-1 except that the first host and the second host were included in a weight ratio (first host:second host) of 0:10.

For the organic light emitting devices manufactured in Examples 4-1 to 4-3 and Comparative Examples 4-1 and 4-2, values measuring driving voltage, current density, light efficiency and color coordinate are described in the following Table 6, and FIG. 5 is a diagram showing current density-driving voltage values of Examples 4-1 to 4-3 and Comparative Examples 4-1 and 4-2.

The black graph presents Comparative Example 4-1, the red graph Example 4-1, the blue graph Example 4-2, the green graph Example 4-3, and the orange graph Comparative Example 4-2.

TABLE 6

| Hole Injection Layer (First Host:Second Host) | Electron Transfer Layer | Volt | J (mA/cm$^2$) | lm/W | CIEx | CIEy |
|---|---|---|---|---|---|---|
| Comparative Example 4-1 | 10:0 | LG-201 + Liq | 3.86 | 10 | 5.45 | 0.137 | 0.101 |
| Example 4-1 | 7:3 | LG-201 + Liq | 3.71 | 10 | 5.30 | 0.137 | 0.101 |
| Example 4-2 | 5:5 | LG-201 + Liq | 3.67 | 10 | 5.21 | 0.137 | 0.101 |
| Example 4-3 | 3:7 | LG-201 + Liq | 3.68 | 10 | 5.09 | 0.137 | 0.102 |
| Comparative Example 4-2 | 0:10 | LG-201 + Liq | 3.65 | 10 | 5.01 | 0.137 | 0.102 |

ETL-A, LG201 and LG201+Liq, electron transfer layer materials respectively used in Experimental Examples 2 to 4, had different electron injection properties, and the properties are excellent in order of LG201+Liq>LG201>ETL-A.

It was identified that the examples of the present application of Tables 4 to 6 were able to adjust a current density-voltage curve (J-V curve) depending on a mixing ratio of the first host and the second host by including two types of hosts having a HOMO energy level value difference of 0.2 eV or greater in the hole injection layer, and from the above-described experimental results, it was identified that an optimized organic light emitting device was able to be manufactured by selecting a proper mixing ratio and thereby adjusting a charge balance even when a structure of the device and/or materials used in the device are changed.

However, in the comparative examples of Tables 4 to 6, it was identified that materials included in the hole injection layer need to be newly developed in order to optimize the device.

In addition, by changing material of the electron transfer layer, a maximum light efficiency (lm/W) value varies depending on a mixing ratio of the first host and the second host, and therefore, it was identified that a mixing ratio for obtaining a maximum light efficiency value may be optimized depending on a device structure.

The invention claimed is:

1. An organic light emitting device comprising:
a first electrode;
a second electrode provided opposite to the first electrode; and
an organic material layer comprising a light emitting layer provided between the first electrode and the second electrode and a hole injection layer provided between the light emitting layer and the first electrode,
wherein the hole injection layer comprises a first host, a second host and a dopant; and
the first host and the second host have a HOMO energy level value difference of 0.2 eV or greater.

2. The organic light emitting device of claim 1, wherein, as for the first host and the second host in a hole only device (HOD) structure comprising only a first electrode formed with indium tin oxide (ITO), a hole injection layer, and a second electrode formed with Al and the hole injection layer having a thickness of 500 Å, a difference between a current density value at 2 V or 3 V when the hole injection layer comprises the first host and a current density value at 2 V or 3 V when the hole injection layer comprises the second host is 200 mA/cm$^2$ or greater.

3. The organic light emitting device of claim 1, wherein a difference between a HOMO energy level value of one or more of the first host and the second host and a LUMO energy level value of the dopant is 0.5 eV or less.

4. The organic light emitting device of claim 1, wherein the organic material layer further comprises a hole transfer layer, and a difference between a HOMO energy level value of one or more of the first host and the second host and a HOMO energy level value of the hole transfer layer is 0.5 eV or less.

5. The organic light emitting device of claim 1, wherein the first host and the second host are an amine-based compound.

6. The organic light emitting device of claim 5, wherein a difference in the number of amine groups of the first host and the second host is 1 or more.

7. The organic light emitting device of claim 1, wherein the first host is represented by the following Chemical Formula 1, and the second host is represented by the following Chemical Formula 2:

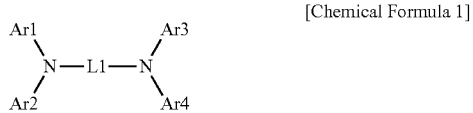

[Chemical Formula 1]

in Chemical Formula 1,
L1 is a substituted or unsubstituted arylene group; and
Ar1 to Ar4 are the same as or different from each other, and each independently a substituted or unsubstituted aryl group; or a substituted or unsubstituted heteroaryl group,

[Chemical Formula 2]

in Chemical Formula 2,

Ar5 to Ar7 are the same as or different from each other, and each independently a substituted or unsubstituted aryl group.

8. A method for manufacturing an organic light emitting device comprising:

preparing a substrate;

forming a first electrode on the substrate;

forming a hole injection layer-comprising organic material layer on the first electrode;

forming a light emitting layer-comprising organic material layer on the hole injection layer-comprising organic material layer; and forming a second electrode on the light emitting layer-comprising organic material layer, where the hole injection layer comprises a first host, a second host and a dopant; and the first host and the second host have a HOMO energy level value difference of 0.2 eV or greater.

9. The method for manufacturing an organic light emitting device of claim 8, wherein the hole injection layer is formed using a solution process or a deposition process.

10. The organic light emitting device of claim 1, wherein the first host and the second host have a HOMO energy level value difference of 2 eV or lower.

11. The organic light emitting device of claim 6, wherein a difference in the number of amine groups of the first host and the second host is 4 or less.

12. The organic light emitting device of claim 5, wherein the first host is a compound having two amine groups, and the second host is a compound having one amine group.

13. The organic light emitting device of claim 7, wherein L1 is a phenylene group unsubstituted or substituted with a methyl group; a biphenylylene group unsubstituted or substituted with a methyl group; a naphthylene group unsubstituted or substituted with a methyl group; a terphenylene group unsubstituted or substituted with a methyl group; or a fluorenylene group unsubstituted or substituted with a methyl group.

14. The organic light emitting device of claim 7, wherein Ar1 to Ar4 are the same as or different from each other, and each independently a substituted or unsubstituted phenyl group; a substituted or unsubstituted biphenyl group; a substituted or unsubstituted naphthyl group; a substituted or unsubstituted fluorenyl group; or a substituted or unsubstituted carbazole group.

15. The organic light emitting device of claim 7, wherein Chemical Formula 1 or Chemical Formula 2 further comprise a curing group.

16. The organic light emitting device of claim 15, wherein the curing group is at least one of the following groups:

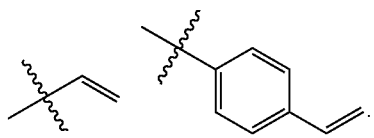

17. The organic light emitting device of claim 7, wherein Chemical Formula 1 is represented by any one of the following compounds:

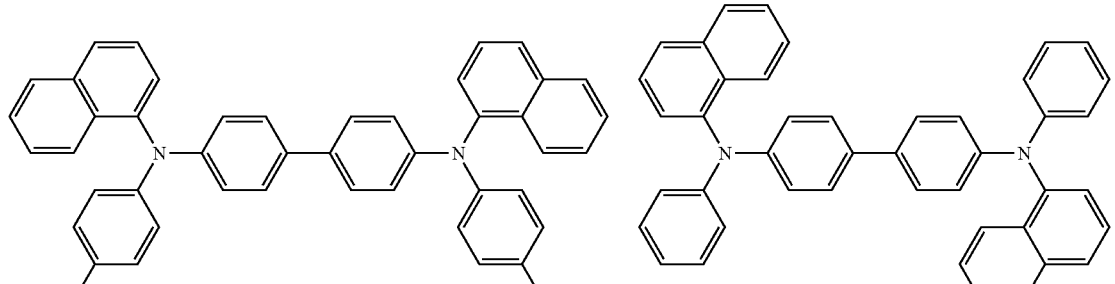

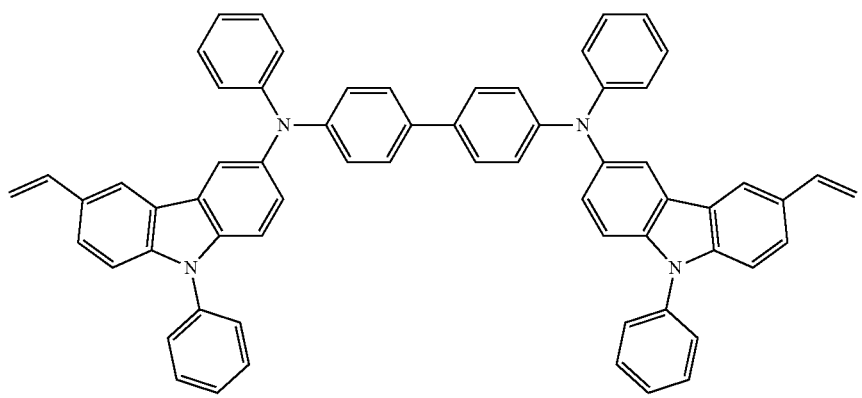

-continued
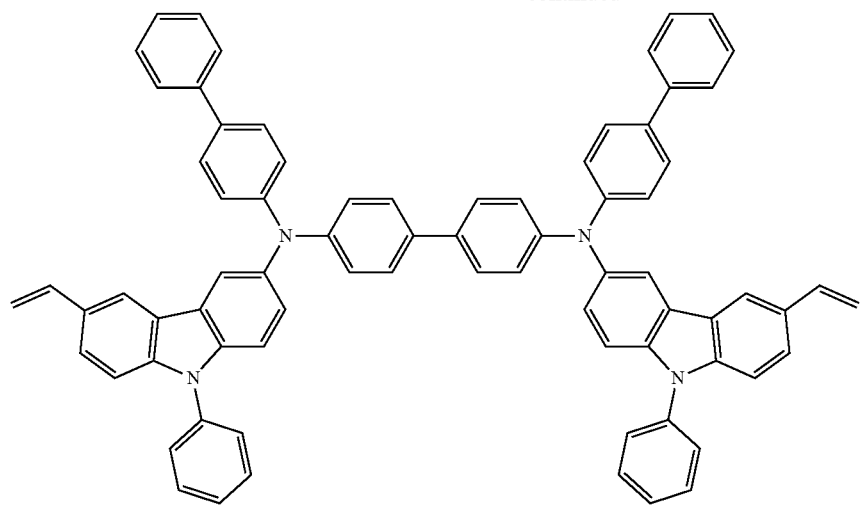
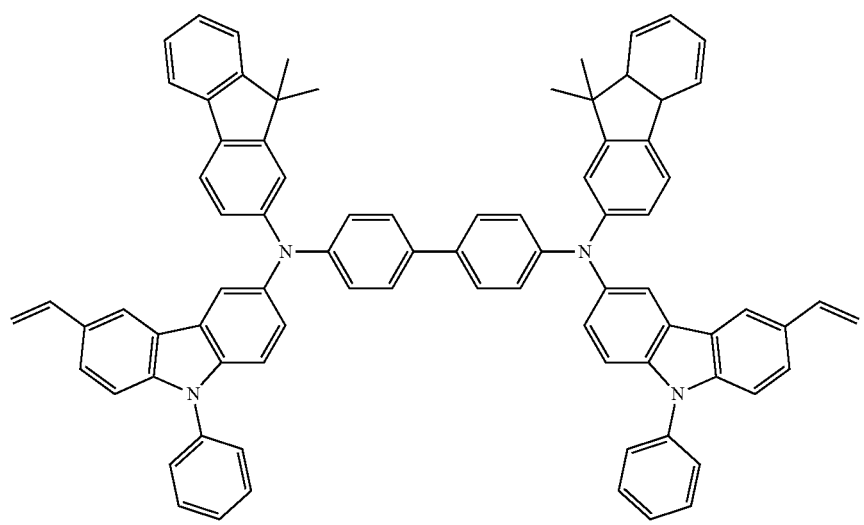
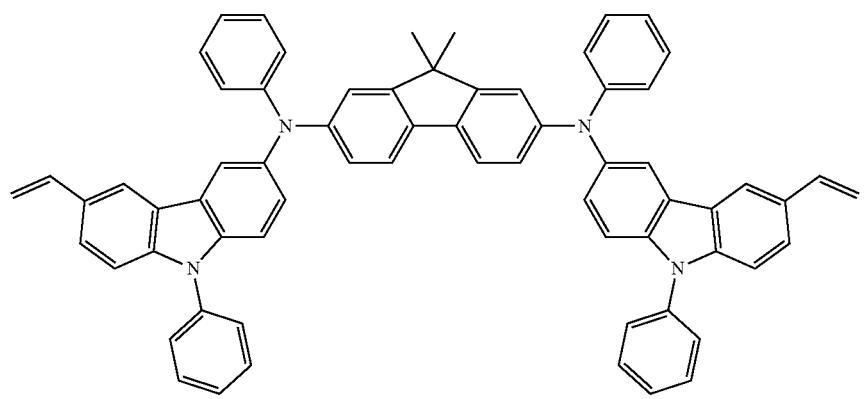

-continued
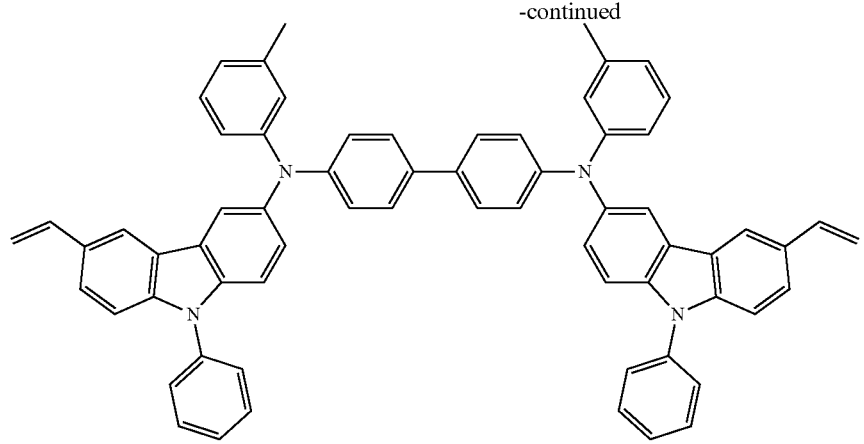
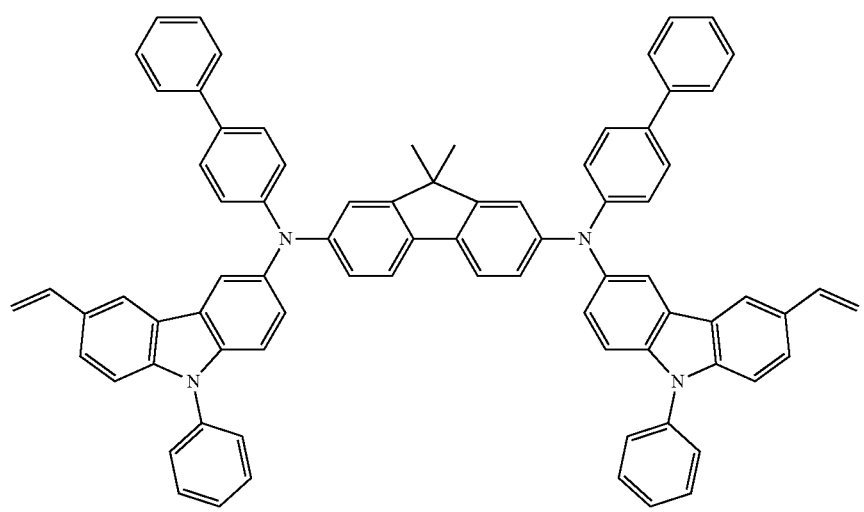
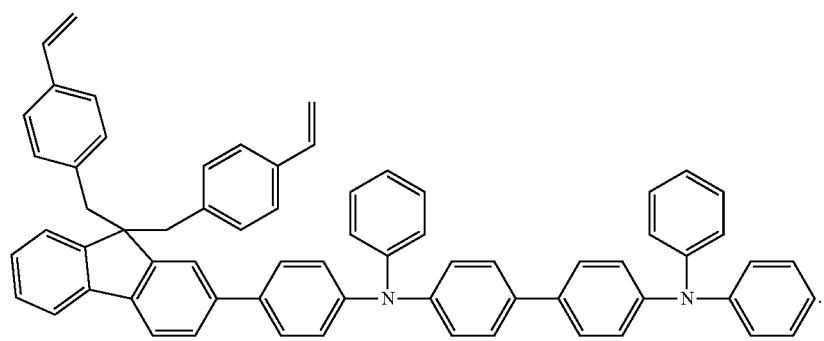
18. The organic light emitting device of claim 7, wherein Ar5 to Ar7 are the same as or different from each other, and each independently a substituted or unsubstituted phenyl group; a substituted or unsubstituted biphenyl group; a substituted or unsubstituted naphthyl group; or a substituted or unsubstituted fluorenyl group.

19. The organic light emitting device of claim 7, wherein Chemical Formula 2 is represented by any one of the following compounds:
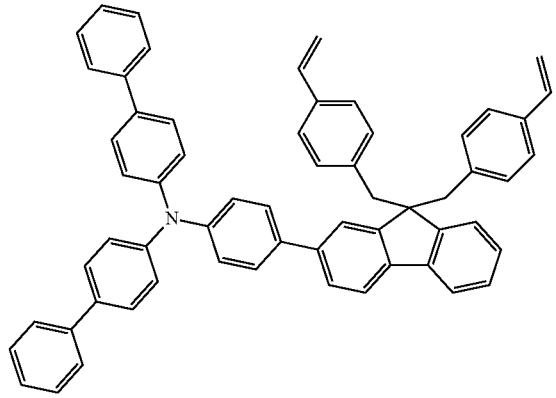
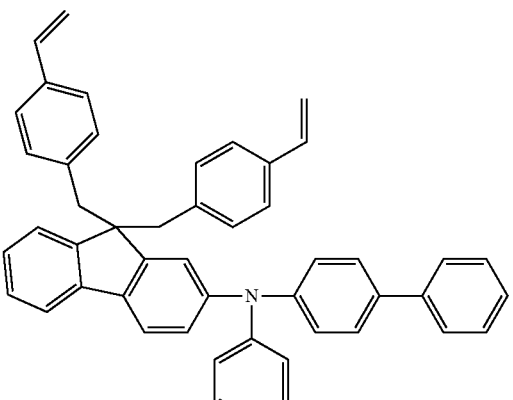
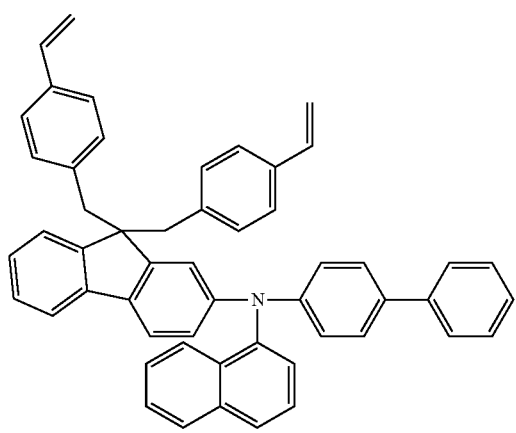
-continued
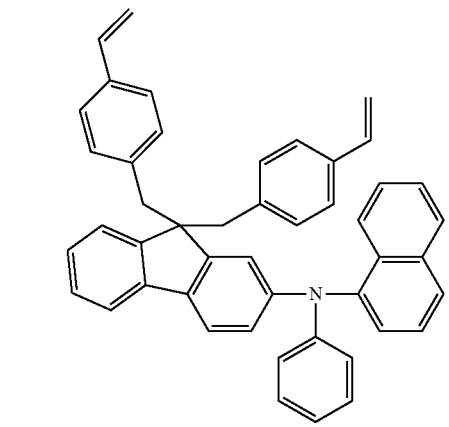
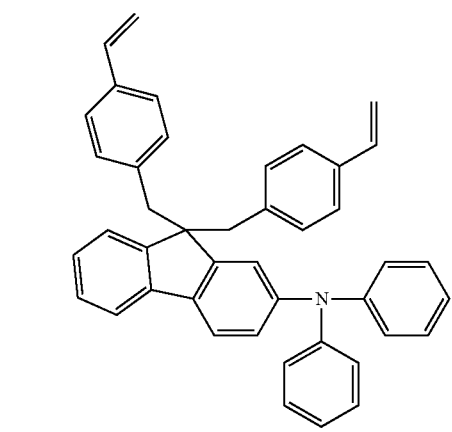
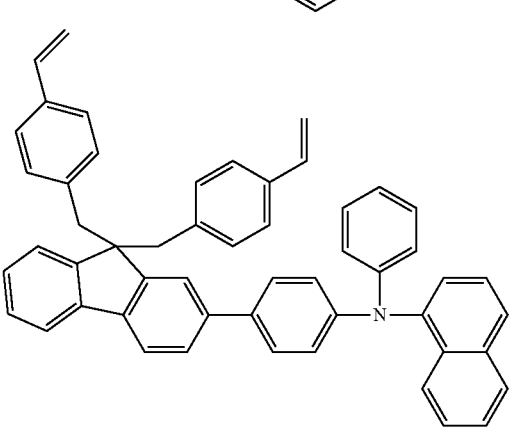

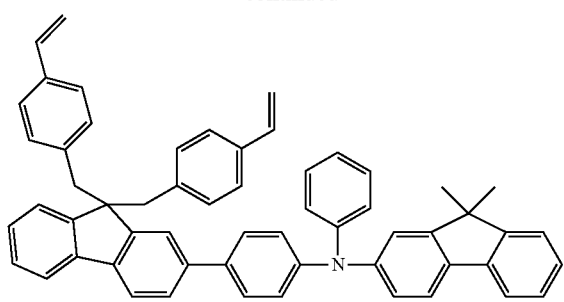
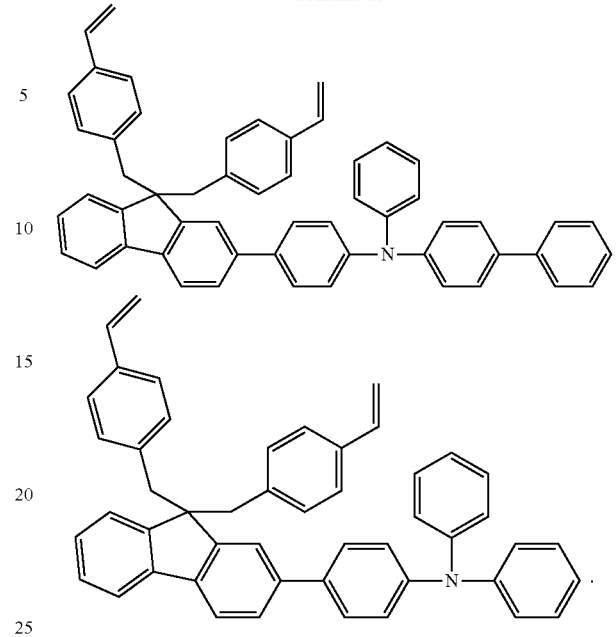
20. The organic light emitting device of claim 1, wherein an amount of the first host and the second host is from 1 wt % to 99 wt % based on a total weight of the first host, the second host and the dopant.
* * * * *